(12) United States Patent
Harvey

(10) Patent No.: US 6,174,803 B1
(45) Date of Patent: Jan. 16, 2001

(54) INTEGRATED CIRCUIT DEVICE INTERCONNECTION TECHNIQUES

(75) Inventor: Ian Harvey, Kaysville, UT (US)

(73) Assignee: VSLI Technology, San Jose, CA (US)

( * ) Notice: Under 35 U.S.C. 154(b), the term of this patent shall be extended for 0 days.

(21) Appl. No.: 09/154,050

(22) Filed: Sep. 16, 1998

(51) Int. Cl.[7] .................. H01L 21/4763; H01L 23/52; H01L 29/40
(52) U.S. Cl. .................. 438/638; 438/637; 257/758
(58) Field of Search .................. 438/622, 637, 438/638; 257/758, 776

(56) References Cited

U.S. PATENT DOCUMENTS

| | | | |
|---|---|---|---|
| 4,367,119 | 1/1983 | Logan et al. | 156/643 |
| 4,536,951 | 8/1985 | Rhodes et al. | 29/589 |
| 4,933,743 * | 6/1990 | Thomas | 357/71 |
| 5,168,078 | 12/1992 | Reisman et al. | 437/195 |
| 5,244,837 | 9/1993 | Dennison | 437/195 |
| 5,258,329 | 11/1993 | Shibata | 437/195 |
| 5,300,813 | 4/1994 | Joshi et al. | 257/752 |
| 5,304,510 | 4/1994 | Suguro et al. | 437/195 |
| 5,366,911 | 11/1994 | Lur et al. | 437/40 |
| 5,371,047 | 12/1994 | Greco et al. | 437/238 |
| 5,382,545 | 1/1995 | Hong | 437/195 |
| 5,399,533 | 3/1995 | Pramanik et al. | 437/228 |
| 5,403,780 | 4/1995 | Jain et al. | 437/195 |
| 5,451,551 | 9/1995 | Krishnan et al. | 437/241 |
| 5,459,100 | 10/1995 | Choi | 437/195 |
| 5,496,771 | 3/1996 | Cronin et al. | 437/187 |
| 5,502,007 | 3/1996 | Murase | 437/225 |
| 5,550,405 | 8/1996 | Cheung et al. | 257/642 |
| 5,556,806 | 9/1996 | Pan et al. | 437/195 |
| 5,571,751 | 11/1996 | Chung | 437/187 |
| 5,578,523 | 11/1996 | Fiordalice et al. | 437/190 |
| 5,591,677 | 1/1997 | Jeng | 437/195 |
| 5,593,919 | 1/1997 | Lee et al. | 437/190 |
| 5,595,937 | 1/1997 | Mikagi | 437/192 |
| 5,597,764 | 1/1997 | Koh et al. | 437/195 |
| 5,602,423 | 2/1997 | Jain | 257/752 |
| 5,612,254 | 3/1997 | Mu et al. | 437/195 |
| 5,618,381 | 4/1997 | Doan et al. | 438/633 |
| 5,635,423 | 6/1997 | Huang et al. | 437/195 |
| 5,659,201 | 8/1997 | Wollesen | 257/758 |
| 5,663,102 | 9/1997 | Park | 438/626 |
| 5,666,007 | 9/1997 | Chung | 257/751 |
| 5,668,052 | 9/1997 | Matsumoto et al. | 438/624 |
| 5,674,781 | 10/1997 | Huang et al. | 437/192 |
| 5,693,563 | 12/1997 | Teong | 437/190 |
| 5,693,568 | 12/1997 | Liu et al. | 437/195 |
| 5,708,303 | 1/1998 | Jeng | 257/758 |
| 5,741,626 | 4/1998 | Jain et al. | 430/314 |

OTHER PUBLICATIONS

Making the Move to Dual Damascene Processing, Semiconductor International; Aug. 1997, pp. 79–80 and 82.

* cited by examiner

Primary Examiner—Charles Bowers
Assistant Examiner—Nema Berezny
(74) Attorney, Agent, or Firm—Woodard, Emhardt, Naughton Moriarty & McNett

(57) ABSTRACT

The present invention relates to multilevel integrated circuit interconnection techniques. An integrated circuit having a number of electronic components along a semiconductor substrate and a first connection layer having a first number of conductors in selective electrical contact with the components is provided. A first insulative layer is formed on the first connection layer with a first pattern of openings therethrough. A second connection layer is established that has a second number of conductors selectively interconnected to the first conductors through the first pattern of openings. A second insulative layer is formed on the first connection layer with a second pattern of openings therethrough. A third connection layer is formed on the second insulative layer having a third dielectric and a third number of conductors selectively interconnecting the second conductors. The first and second insulative layers are preferably etch selective to a dielectric included in the first, second, and third connection layers; and crossover, crossunder, or local interconnects are formed in a different connection layer than routing interconnects to facilitate higher interconnection density.

24 Claims, 16 Drawing Sheets

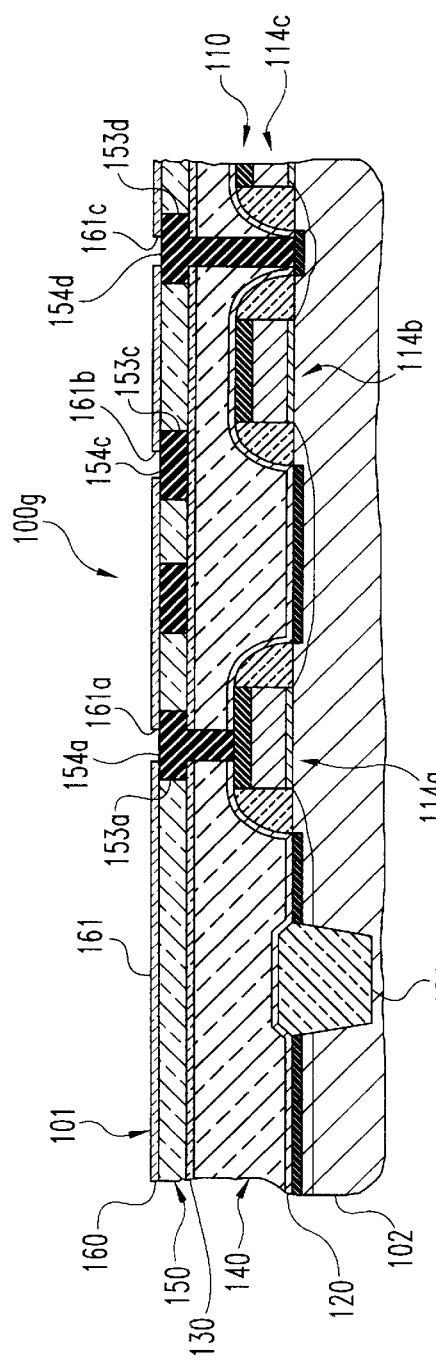
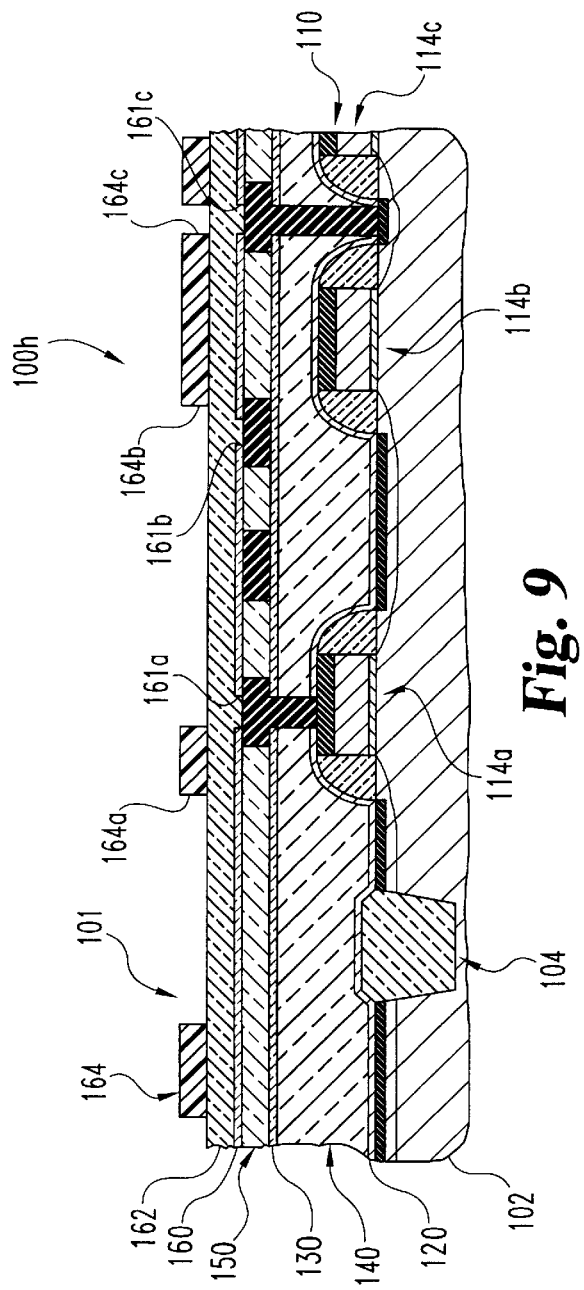

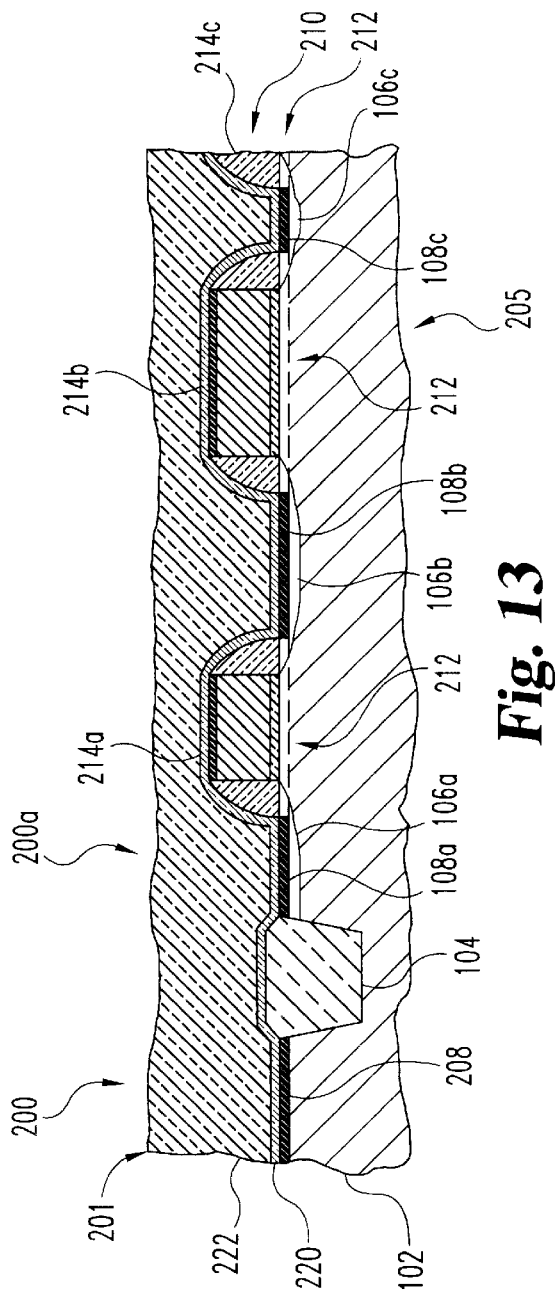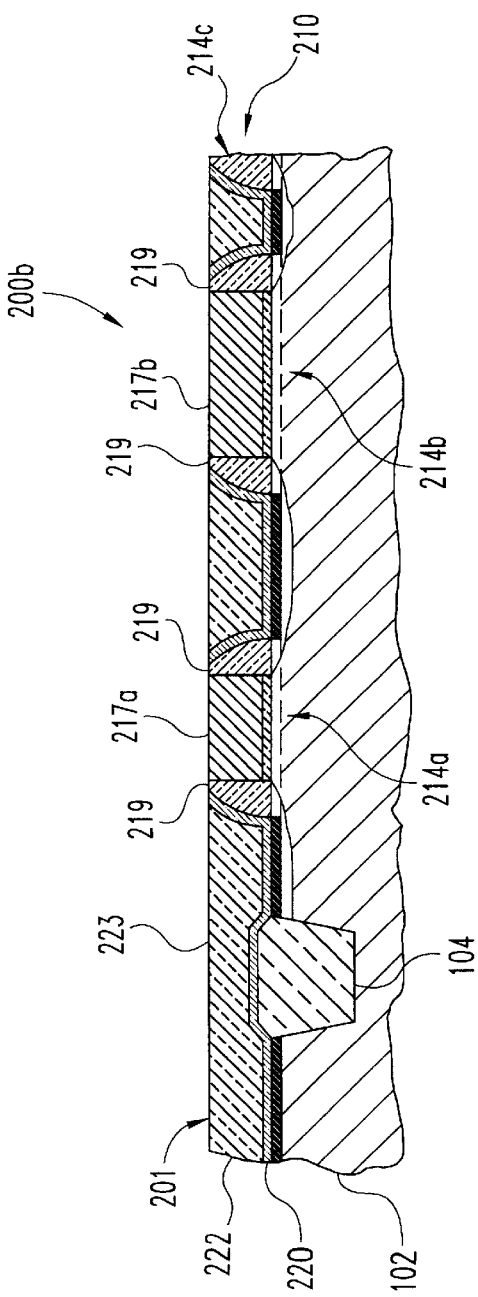

INTEGRATED CIRCUIT DEVICE INTERCONNECTION TECHNIQUES

BACKGROUND OF THE INVENTION

The present invention relates to interconnection and routing techniques for integrated circuit components, and more particularly, but not exclusively relates to a multilevel architecture having greater layout flexibility that facilitates higher routing and interconnection density.

The need for faster and more complex electronic components fuels a desire to decrease the size of integrated circuit components. Correspondingly, it is often desirable to reduce the size of electrical interconnects for these components while maintaining high reliability and low electrical resistance. Highly conductive materials, such as metals, are often necessary for forming integrated circuit interconnects. One approach is to form a stack of interconnected layers that each include a pattern of elongate metal traces or via plugs insulated from one another by a dielectric. Usually, vertical via plugs in one layer are used to provide electrical connection between adjacent layers. Photolithographic patterning and associated etching processes typically provide the desired pattern for each layer. Unfortunately, the current desire to shrink the critical dimensions of active integrated circuit transistors deep into the submicron range (e.g. less than about 0.25 microns) limits the ability to correspondingly reduce metal conductor size through direct metal etching. As a result, new approaches have been sought to provide for the corresponding increased density of integrated circuit device interconnections.

FIG. 1 illustrates further limitations of existing approaches. Integrated circuit 50 of FIG. 1 includes substrate 52 with component connection sites 56a, 56b therealong. Oxide layer 60 covers substrate 52 and defines via holes for metal via plugs 62a, 62b to electrically contact sites 56a, 56b, respectively. Layer 64 is formed on top of layer 60 to provide a pattern of metal traces 66 insulated from each other by a dielectric—typically a silica (silicon dioxide) based material. Two of traces 66 are shown in electrical contact with plugs 62a, 62b to provide selected electrical contact with sites 56a, 56b, respectively.

Layer 70 is formed on layer 64 and includes a pattern of metallic via plugs 72 insulated from each other by a dielectric—also usually a silica-based material. Layer 74 is formed on layer 70 and includes a pattern of metal traces 76 insulated from each other in a similar manner to layer 64. Plugs 72 of layer 70 interconnect selected traces 66 and 76 of layers 64 and 74, respectively, to provide a predetermined wiring pattern for circuit 50. It should be noted that traces 66 include a crossunder connection specifically designated by reference numeral 66a to provide electrical coupling between two traces 76 of layer 74 that are separated by another trace specifically designated by reference numeral 76b. Similarly, traces 76 include a crossover connection designated by reference numeral 76a to provide electrical coupling between two traces 66 of layer 64. Notably, crossover 76a is routed around the trace specifically designated by reference numeral 66b by elevation to the next metallization level of layer 74. The crossover and crossunder connections have a longitudinal orientation that is generally perpendicular to the longitudinal orientation of other traces contained in the same layer. This orientation tends to limit the number of traces that may be included in a given layer.

A similar limitation to the "packing density" of integrated circuit interconnects arises from the occupation of layer "real estate" by dedicated, long-distance power supply bus traces in the same layer as long-distance signal carrying traces. Typically, power supply traces are about 10 to 50 times wider than other types of signal routings. Also, the more costly dielectric materials often utilized to preserve the integrity of long-distance, time-varying signal conductors are usually not needed for power supply conductors. Traces designated by reference numerals 66b, 76b in layers 64, 74, are representative of power supply bus connections of existing integrated circuit arrangements.

Thus, a need remains for techniques to further increase the density of integrated circuit component interconnects. The present invention satisfies this need, generally improves integrated circuit layout flexibility, and provides other significant benefits and advantages.

SUMMARY OF THE INVENTION

The present invention relates to techniques for interconnecting integrated circuit components. Various aspects of the invention are novel, nonobvious, and provide various advantages. While the actual nature of the invention covered herein can only be determined with reference to the claims appended hereto, certain forms that are characteristic of the preferred embodiments disclosed herein are described briefly as follows.

One form of the present invention includes a multilevel interconnection technique having crossover, crossunder, or local interconnects in a different connection layer than routing interconnects. These different connection layers are preferably separated by an insulative hard mask that functions as an etch stop layer relative to a dielectric included in the connection layers. As used herein, a "routing interconnect" refers to an electrical connection that traverses several integrated circuit components; and a "local interconnect" refers to an electrical connection of two or more routing interconnects, two or more connection regions of the same integrated circuit component, or two or more connection regions of adjacent integrated circuit components. As a result, routing interconnects typically provide longer range, lower resistance electrical coupling of components that are remotely located from each other. It is also preferred that the connection layer dielectric be comprised of a silica-based material and that the insulative hard mask be comprised of a silicon nitride or silicon oxynitride based material.

Another form includes an integrated circuit device with a number of electronic components along a semiconductor substrate and a first connection layer comprised of a first dielectric and a first number of conductors in selective electrical contact with the components. A first insulative layer is positioned on the first connection layer with a first pattern of openings therethrough. Also included is a second connection layer comprised of a second dielectric and a second number of conductors, a second insulative layer on the second connection layer with a second pattern of openings therethrough, and a third connection layer on the second insulative layer. The third connection layer is comprised of a third dielectric and a third number of conductors. The third dielectric is etch selective to the second insulative layer. The second and third conductors are in contact with the second insulative layer and at least one of the second conductors crosses at least one of the third conductors, being electrically isolated therefrom by the second insulative layer. The second conductors may be utilized to form a number of overpass or crossover connections between the first conductors and a number of underpass or crossunder connections between the third conductors. Further, the second conductors may include one or more power bus distribution conductors to free the first and third layers from providing the significant amount of space usually needed to accommodate power supply conductors. As a result, the first and third layers may have a comensurately higher routing interconnect density.

A further form includes provision for compatibility with Damascene integrated circuit architecture. This form includes providing an integrated circuit device with a number of electronic components on a substrate and planarizing a first dielectric layer formed over the components. A first insulative hard mask is formed on the first layer and a second dielectric layer on the first hard mask. A first pattern of openings is defined through the first hard mask. The first and second layers are etched selective to the first hard mask to form a first number of recesses in the second layer with a portion of the recesses corresponding to the first pattern of openings extending through the first layer. The first recesses are at least partially filled to define a first number of conductors in selective contact with the components through the first pattern of openings. A second insulative hard mask is deposited on the second layer and a third dielectric layer is deposited on the second hard mask. The third layer is etched selective to the second hard mask to define a second number of recesses therein that are at least partially filled to define a second number of conductors selectively connecting the first conductors through a second pattern of openings defined in the second hard mask. A third insulative hard mask is deposited on the third layer and a fourth dielectric layer is deposited on the third hard mask. The fourth layer is etched selective to the third hard mask to form a third number of recesses that are at least partially filled to define a third number of conductors selectively connected by the second conductors through a third pattern of openings defined in the third hard mask. At least a portion of the first and third conductors are routing interconnects.

Yet another form includes providing a number of electronic components on a substrate and selectively removing a first dielectric layer deposited over the components to define a first number of recesses each exposing at least two electrical contact surfaces of the components. The first recesses are each generally filled to provide a corresponding number of local interconnects. A first insulative hard mask is formed on the first layer and local interconnects, and a second dielectric layer including a first number of conductors is formed over the first hard mask. The first conductors are selectively electrically coupled to the components through a first pattern of openings in the first hard mask. A second hard mask with a second pattern of openings is formed over the second layer. A third dielectric layer in contact with the second hard mask is formed and the third layer is etched selective to the second hard mask to form a second number of recesses. The second recesses are at least partially filled to define a second number of conductors in the third layer that selectively connect the first conductors through a second pattern of openings defined by the second hard mask. The first conductors and the second conductors are in contact with the second hard mask.

Accordingly, it is one object of the present invention to provide techniques to electrically interconnect integrated circuit components.

It is another object to provide local interconnect, crossover, and crossunder connections in a different layer than routing interconnects.

It is a further object to provide underpass, overpass, and via plug connections in a common layer between routing interconnect layers by adding only a single mask deposition and etch process.

It is yet another object to provide multiple connection layers separated by hard masks, where the dielectric of the connection layers and the hard masks may be etched selective to each other.

Further objects, forms, features, aspects, benefits, and advantages of the present invention shall become apparent from the detailed drawings and descriptions provided herein.

BRIEF DESCRIPTION OF THE DRAWINGS

The following figures illustrate selected processing stages of an integrated circuit device with like reference numerals representing like features. The figures are not drawn to scale to enhance clarity.

FIGS. 2–12 are partial, sectional side views of an integrated circuit device as it progresses through selected processing stages 100a–100k in accordance with one embodiment of the present invention.

FIGS. 13–25 are partial, sectional side views of an integrated circuit device as it progresses through selected processing stages 200a–200m in accordance with another embodiment of the present invention.

DESCRIPTION OF THE PREFERRED EMBODIMENTS

Figure 1:
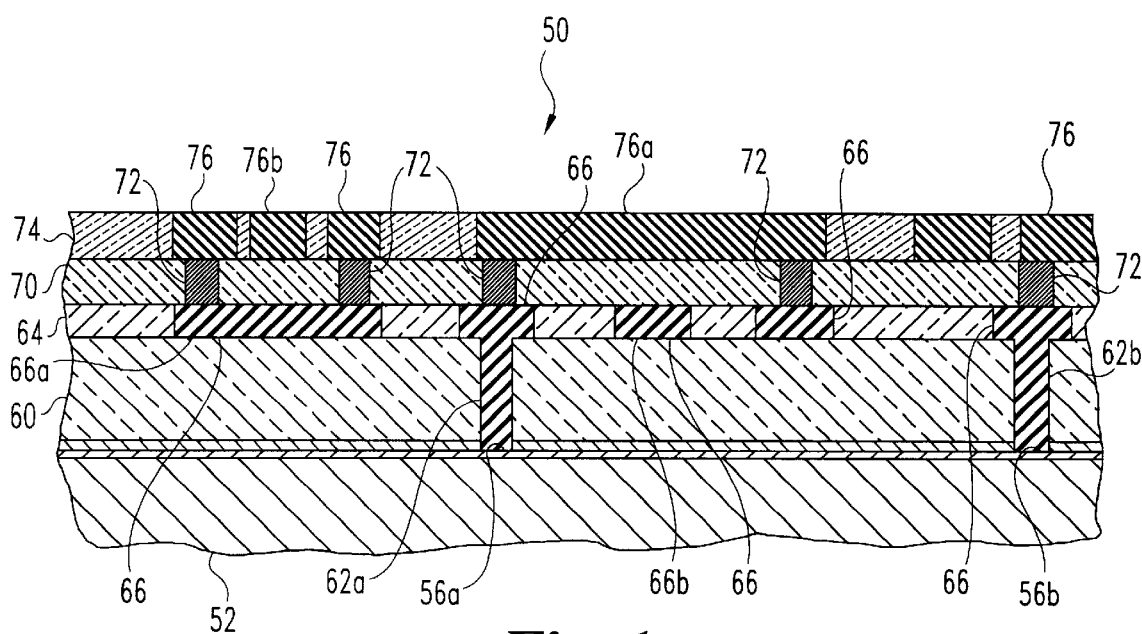
FIG. 1 is a partial, sectional view of an existing integrated circuit.
Figure 2:
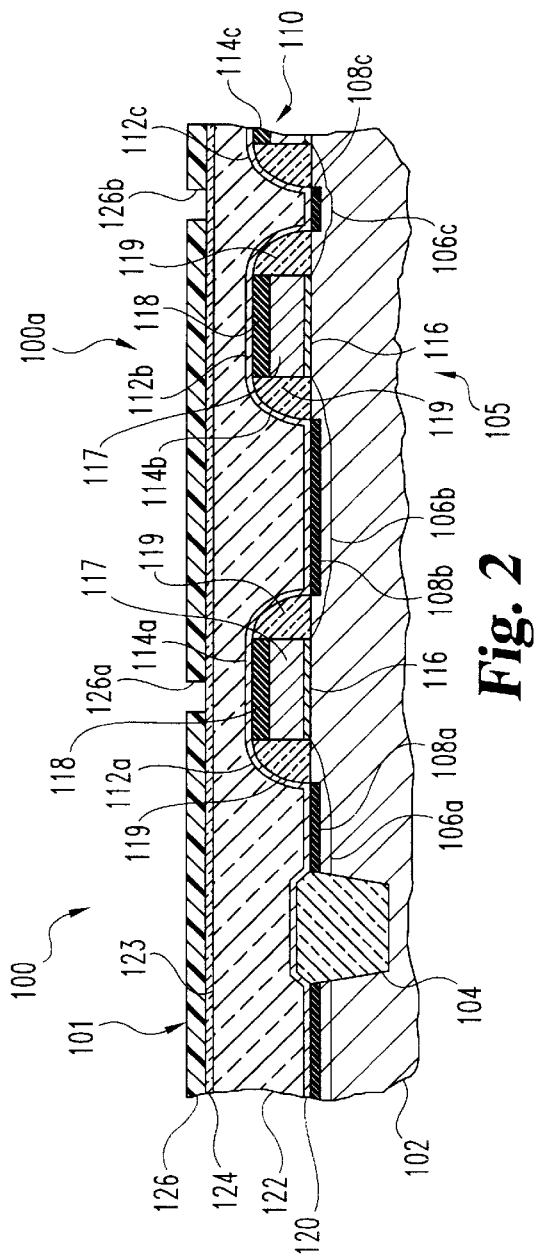

For the purposes of promoting an understanding of the principles of the invention, reference will now be made to the embodiments illustrated in the drawings and specific language will be used to describe the same. It will nevertheless be understood that no limitation of the scope of the invention is thereby intended. Any alterations and further modifications in the described embodiments, and any further applications of the principles of the invention as described herein are contemplated as would normally occur to one skilled in the art to which the invention relates. In the following detailed description, numerous specific details are set forth in order to provide a thorough understanding; however, it will be obvious to one of ordinary skill in the art that the present invention may be practiced without these specific details. Well known methods, procedures, processes, components, and circuits have not been described in detail so as not to unnecessarily obscure other aspects.

FIGS. 2–12 depict partial, cross-sectional side views of selected stages 100a–100k in the manufacturing process 100 of integrated circuit device 101. Referring specifically to stage 100a shown in FIG. 2, device 101 is depicted after various front-end processing has been performed. Device 101 includes semiconductor substrate 102. Substrate 102 is preferably of a generally planar form that extends perpendicular to the view plane of FIG. 2. Furthermore, it is preferred that substrate 102 be of the single-crystal silicon variety; however, other substrate compositions may be utilized as would occur to those skilled in the art.

Device 101 also includes electrical isolation structure 104. Structure 104 comprises a dielectric-filled recess in substrate 102 formed in accordance with shallow trench isolation techniques. In other embodiments, such isolation structures may not be utilized or a different isolation structure variety may be employed. Structure 104 bounds component region 105 having several integrated circuit components 110. Component region 105 includes doped regions 106a, 106b, 106c. Typically, regions 106a–106c are of one conductivity type and positioned in a well of substrate 102 doped with the opposite conductivity type to form desired p-n junctions for components 110. Silicide substrate regions 108a, 108b, 108c are correspondingly positioned over regions 106a, 106b, 106c and are in electrical contact therewith to facilitate electrical contacts with components 110 as needed.

Components 110 include a number of Insulated Gate Field Effect Transistors (IGFETs) 112a, 112b, 112c. IGFET 112c is only partially shown. IGFETs 112a, 112b, 112c each include a corresponding insulated gate 114a, 114b, 114c upwardly extending away from substrate 102 along the view plane of FIG. 2. Each gate 114a, 114b, 114c includes dielectric pad 116, a polycrystalline silicon portion 117 on pad 116, and a silicide portion 118 on portion 117. Pad 116, portion 117, and portion 118 are collectively bounded by a pair of dielectric spacer walls 119. Gates 114a–114c cooperate with doped regions 106a–106c to define channel areas beneath pads 116 and corresponding source and drain areas for each transistor 112a–112c. Notably, regions 106b and 106c are disposed as common source or drain areas with respect to transistors 112a–112c. Components 110 of device 101 may include additional transistors, resistors, diodes, capacitors, fuses, or other active or passive integrated circuit component types as would occur to those skilled in the art.

In one preferred embodiment, front-end processing of device 101 to reach stage 100a begins with the formation of isolation structures, such as structure 104, using conventional techniques. Next, transistors are formed beginning with the establishment of corresponding n- and p-wells in substrate 102 using standard techniques. After well formation, a suitable gate dielectric layer is formed on substrate 102 from which pads 116 will be provided. Preferably, the gate dielectric is formed from a silicon dioxide layer having a thickness of about 54 angstroms. After formation of the gate dielectric layer, an amorphous silicon layer is deposited thereon. The amorphous silicon layer and gate dielectric layer are patterned to form strips corresponding to gates 114a–114b using standard photolithographic techniques. Gate spacers, such as spacer walls 119, are formed as part of the front-end processing, preferably in conjunction with a Lightly Doped Drain (LDD) formation procedure. Typically, source/drain formation includes depositing an implant screen oxide layer on device 101, and implanting substrate 102 with n+ or p+ dopant to form regions such as those designated by reference numerals 106a–106c. For example, n+ implantation may be accomplished by implanting ionized arsenic atoms (As) at about 60 Kev $2 \times 10^{15}$ $cm^{-2}$; and p+ implantation may be accomplished by implanting ionized boron difluouride ($BF_2$) at about 50 keV $3 \times 10^{15}$ $cm^{-2}$. For this embodiment, implantation is preferably followed by a Rapid Thermal Anneal (RTA) at about 1000° C. for about 30 seconds to activate the implanted dopants. After implantation, the screen oxide layer is typically removed and the surface cleaned.

Front-end processing also typically changes the crystal lattice of the amorphous silicon into polycrystalline silicon ("polysilicon"). Next, for the preferred front-end process, silicide formation takes place. The formation of silicide substrate regions 108a–108c and silicide portions 118 may be accomplished by blanketing device 101 with a suitable metal such as titanium (Ti), cobalt (Co), or nickel (Ni); although other materials suitable for silicidation are also contemplated. Once blanketed, at least one rapid thermal anneal (RTA) is performed to combine metal atoms from the metallic layer with atoms from the silicon in contact therewith. In the case of regions 108a–108c, silicon from substrate 102 would preferably be consumed. In the case of gates 114a–114c, silicon from polycrystalline silicon portions 117 would be consumed by this process.

After this rapid thermal anneal is performed, the unconsumed part of the metal layer is typically removed by an etching process. Following removal of the excess metal, additional rapid thermal anneals may be performed. In particular, for a Ti blanket of about 55 nanometers, it has been found that a second Rapid Thermal Anneal (RTA) sufficient to convert the $C49$-$TiSi_2$ crystal structure to a $C54$-$TiSi_2$ crystal structure is desirable to lower sheet resistance. For this titanium silicide approach, a first RTA at about 720 degrees for about 30 seconds, followed by a wet etch to remove excess Ti, and a second RTA at about 850 degrees Celsius for about 30 seconds is preferred. In another approach, silicide portions 118 may be formed independently of the silicide substrate regions 108a–108c. Commonly owned U.S. patent application Ser. No. 08/885,740 to Harvey et al., filed Jun. 30, 1997, further details silicidation techniques that may be utilized in the front-end processing of device 101, and is hereby incorporated by reference in its entirety. In still other embodiments, different front-end processing of device 101 may be utilized as would occur to those skilled in the art.

After front-end processing results in the formation of components 110 along substrate 102, a dielectric barrier layer 120 is deposited that blankets device 101. Preferably, barrier layer 120 is formed from silicon nitride or silicon dioxide; however, other compositions may be utilized as would occur to one skilled in the art. Indeed, in one alternative embodiment, a barrier layer 120 is not utilized at all. Dielectric filler layer 122 is deposited on layer 120, having a thickness greater than the collective thicknesses of pad 116, polycrystalline silicon portion 117, and silicide portion 118 to generally fill space between gates 114a–114c and cover substrate 102. Preferably, layer 122 is formed by coating device 101 with a silicon dioxide based dielectric and then planarizing device 101 with a compatible Chemical-Mechanical Polishing (CMP) technique to define generally planar surface 123.

An insulative layer 124 is formed on surface 123. Photoresist pattern 126 is then formed on layer 124 using standard photolithographic techniques. Pattern 126 is depicted with openings 126a, 126b which expose corresponding regions of layer 124. Layer 124 is preferably formed from a material that may be etched selective to layer 122 in accordance with pattern 126. Pattern 126 is utilized to selectively etch layer 124 and transform it into an insulative etch stop hard mask 130 with a pattern of openings 131, including openings 131a, 131b corresponding to openings 126a, 126b as shown in stage 100b of FIG. 3. After forming hard mask 130 from layer 124, pattern 126 is stripped in a standard fashion to provide device 101 as shown in stage 100b.

In one embodiment, layer 124 is provided by a coating of silicon nitride (SiN) or silicon oxynitride (SiON) with a thickness of less than about 1,000 angstroms. For this embodiment, pattern 126 has a relatively thin thickness of about 3,000 angstroms to provide an optimum amount of focus latitude for photolithographic equipment used in the patterning process. Such focus latitude facilitates formation of a high resolution pattern in pattern 126 and correspondingly in pattern 131. The antireflective properties of silicon nitride or silicon oxynitride for layer 124 facilitates the reduction of reflections which tend to distort patterns produced by photolithographic processing.

Figure 3:
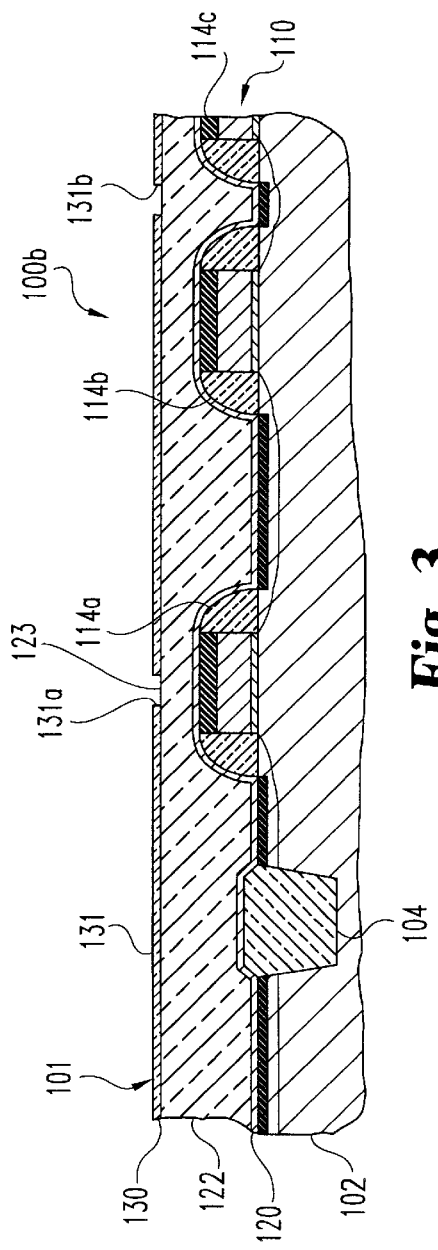
Figure 4:
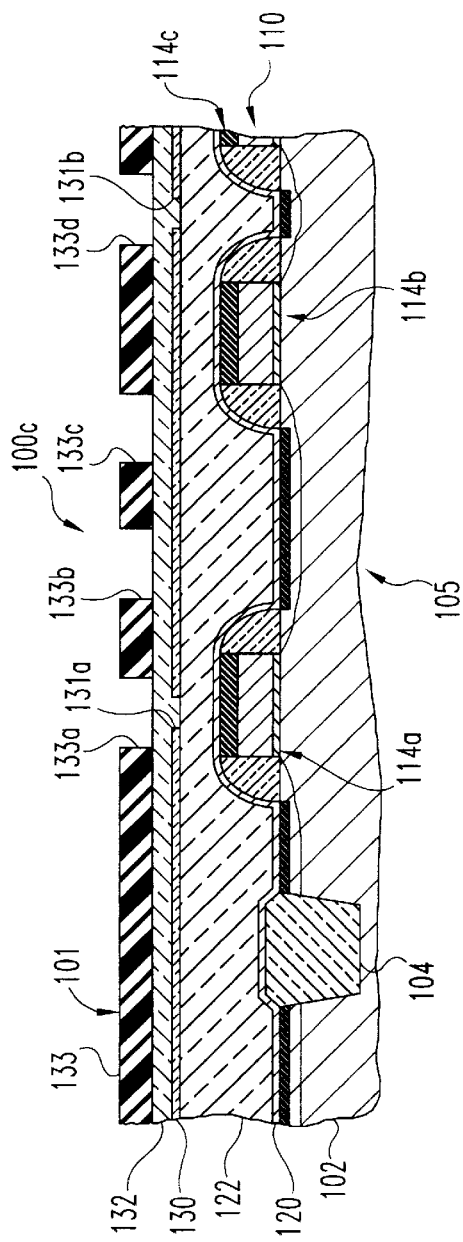

Progression from stage 100b of FIG. 3 to stage 100c of FIG. 4 is accomplished by depositing dielectric layer 132 on hard mask 130 that generally fills openings 131a, 131b. Preferably, dielectric layer 132 may be etched selective to hard mask 130. As a result, hard mask 130 behaves as an etch stop relative to layer 132. It is also preferred that dielectric 132 be formed by depositing a flowable, low dielectric constant Spin-On-Glass (SOG) to maintain a generally planar structure while still filling openings 131a, 131b of pattern 131. A low dielectric constant material or "low-k dielectric" is typically desired between long-distance routing interconnects that carry time varying signals to reduce capacitive losses. However, such materials are usually more costly than dielectrics with a higher dielectric constant ("high-k dielectrics") and are often more difficult to process effectively. As a result, it is often desirable to judiciously limit the use of low-k dielectrics to connection layers with routing interconnects. It is preferred that the dielectric constant of the material used between routing interconnects of such connection layers be less than about 3.9 relative to the commonly known scale where the dielectric constant of a vacuum is 1.0 under like conditions. Typically, preferred SOGs for dielectric 132 are nonstoichiometric forms of a silica-based glass. It is most preferred that dielectric layer 132 be formed by spinning on Hitachi Silica Glass (HSG) supplied by Kabushiki Kaisha Hitachi Seisakusho (Japanese Corporation); d/b/a Hitachi, Ltd., with a business address of 6 Kanda-Surugadai, 4 Chome, Choyoda-Ku, Tokyo, Japan.

In connection layers dedicated to short-run connections such as crossovers, crossunders, local interconnects, and via plugs; a material with a relatively higher dielectric constant such as tetraethylorthosilicate (TEOS) or phosphosilicate Glass (PSG) is preferred. This type of material is an approximately stochiometric silica-based dielectric that may readily etched along with nonstochiometric silica-based SOGs to streamline processing.

Dielectric layer 132 is masked with photoresist pattern 133 in stage 100c using common techniques. Pattern 133 defines openings 133a–133d to expose corresponding regions of layer 132. Notably, openings 133a and 133d correspond to openings 131a and 131b of pattern 131 of hard mask 130. Photoresist Pattern 133 is utilized to selectively remove layer 132 where exposed through openings 133a–133d selective to hard mask 130 to correspondingly form recesses 135 as shown in stage 100d of FIG. 5. Further removal takes place through openings 131a, 131b into layer 122. Preferably, selective removal of layers 132 and layer 122 through pattern of openings 131 is performed using a common etching procedure that is selective to hard mask 130.

Stage 100d further shows device 101 after photoresist pattern 133 has been stripped. The formation of recesses 135 transforms layers 122, 132, into patterned dielectrics 142, 152, respectively. Recesses 135 include channels 136a–136d defined by dielectric 152 and via holes 137a and 137b defined by dielectric 142. Via holes 137a, 137b intersect channels 136a and 136d through openings 131a, 131b, respectively. Hard mask 130 defines the lower limit for channels 136a–136d where present. Notably, channels 136a and 136d have a greater width than the corresponding via holes 137a and 137b to improve tolerance to any misalignment of pattern 133 relative to hard mask 130.

Figure 5:
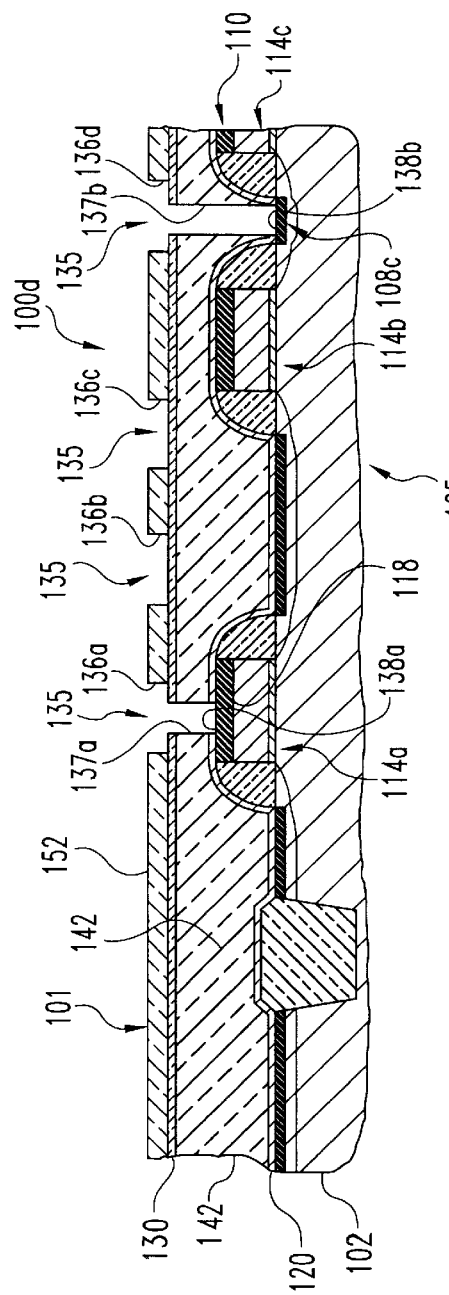

FIG. 5 also shows that portions of barrier layer 120 corresponding to via holes 137a, 137b have been removed to expose silicide component connection regions 138a and 138b, respectively. When barrier layer 120 is formed of a nitride compound, removal of it may be performed separately, selective to layers 132 and 122. This approach may also remove some or all of hard mask 130 exposed in channels 136a–136d (not shown), but removal at this stage does not impact integrity of device 101 as will become apparent in connection with the description of later stages. In other embodiments, barrier layer 120 may be removed selective to hard mask 130 or may be mutually etched with layers 122 or 132. In still other embodiments, barrier layer 120 may be absent.

Figure 6:
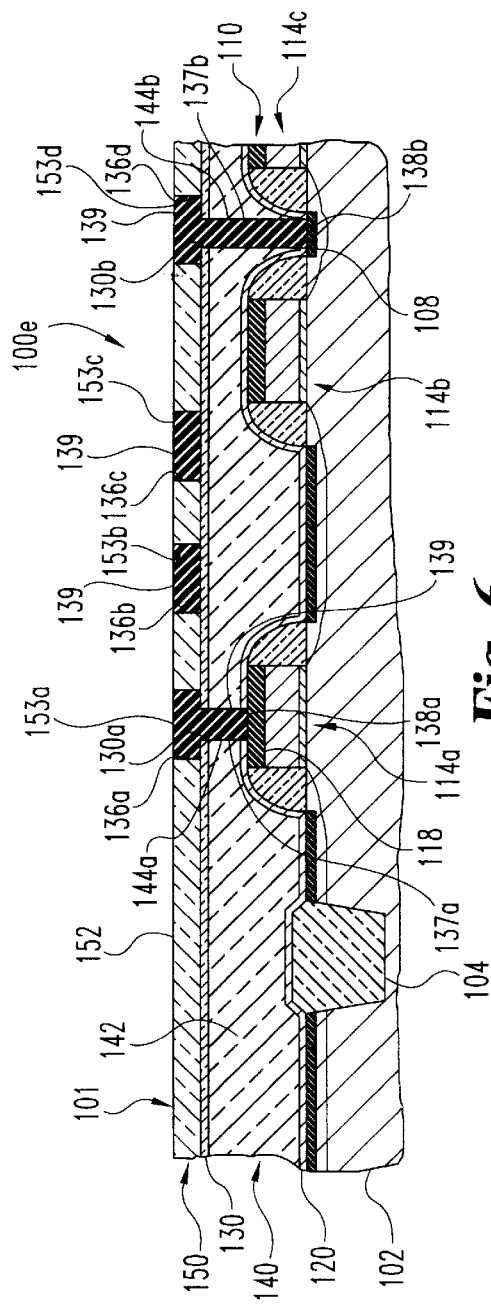

Stage 100e of FIG. 6 results from the subsequent deposition of a conductive material in recesses 135 to form a corresponding number of conductors 139. Conductors 139 include plug conductors 144a, 144b in via holes 137a, 137b defined by patterned dielectric 142. Collectively, conductors 144a, 144b and dielectric 142 form connection layer 140. Conductors 144a, 144b electrically contact component connection regions 138a, 138b. Also, conductors 139 include routing interconnect conductors 153a–153d in channels 136a–136d defined by patterned dielectric 152. Collectively, conductors 153a–153d and dielectric 154 form connection layer 150. Conductors 153a–153d and channels 136a–136d are elongate, running for relatively long distances in a direction perpendicular to the view plane of FIG. 6 to provide routing interconnects between various components of device 101 (not shown). Such long-distance runs may also be used to provide selected signals to other circuit components (such as buffers, filters, memory cells, and the like) or to external bonding pads (not shown). Notably, conductors 153a and 153d are integrally formed with conductors 144a and 144b of connection layer 140 by passage of the conductive material through openings 131a and 131b of hard mask 130, respectively.

Preferably, the conductive material deposited in recesses 135 is a metal suitable for electrical interconnections in an integrated circuit device. For example, aluminum (Al), cobalt (Co), copper (Cu), gold (Au), nickel (Ni), platinum (Pt), silver (Ag), titanium (Ti), or tungsten (W) may be appropriate for the formation of conductive members 139 using suitable deposition techniques as are known to those skilled in the art. A Chemical Vapor Deposition (CVD), a Physical Vapor Deposition (PVD), a force-fill technique, or any other technique known to those skilled in the art may be used that is suitable for the selected conductive material. Furthermore, more than one type of metallic material may be used and the conductive material may include one or more desired barrier or adhesion layers to facilitate a suitable interconnection arrangement as are known to those skilled in the art. Indeed, in one alternative embodiment, conductors 144a, 144b are formed from one type of conductive material and conductors 153a–153d are provided from another type of conductive material. After deposition of the conductive material or materials is complete, device 101 is planarized by a compatible process such as Chemical-Mechanical-Polishing (CMP) or blanket etching. It is also preferred that this process remove any excess conductive material residing outside of recesses 135.

Figure 7:
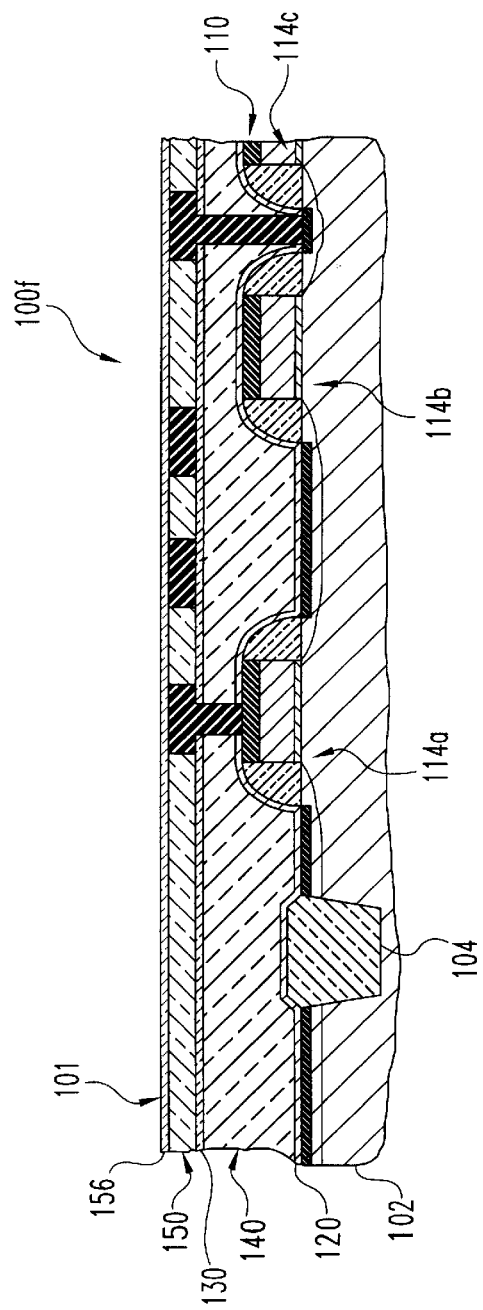

Stage 100f of FIG. 7 depicts device 101 after insulative layer 156 is formed on connection layer 150. Preferably, layer 156 may be etched in the same manner as hard mask 130. More preferably, hard mask 130 and layer 156 are each formed from the same nitride or silicon oxynitride composition to serve as etch stops for silica-based dielectrics positioned therebetween, and further to provide desirable antireflective properties.

Figure 10:
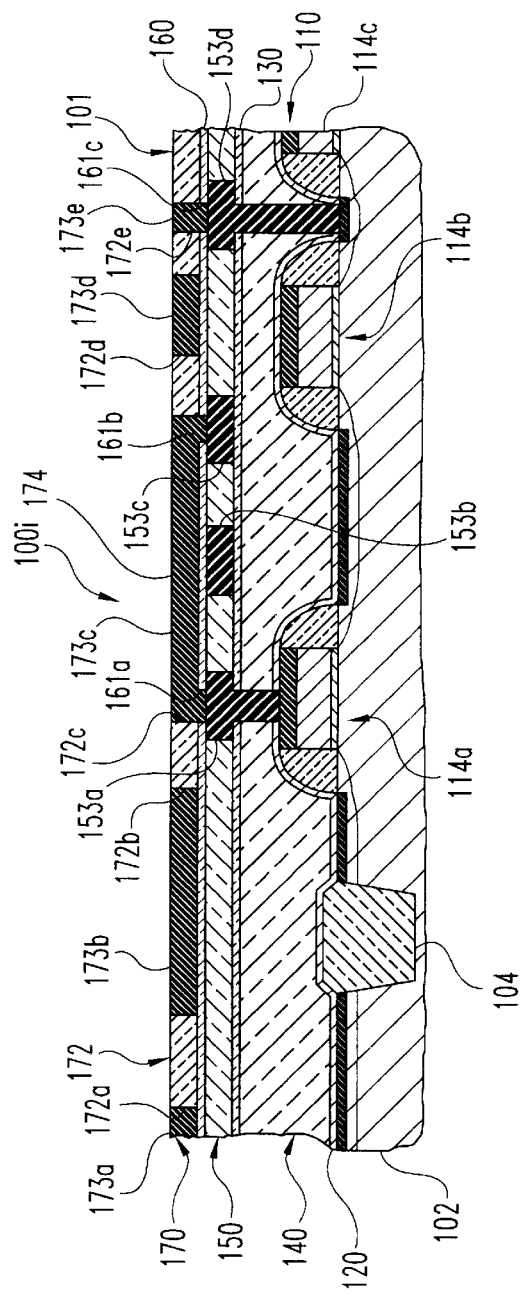

Referring to stage 100g depicted in FIG. 8, layer 156 is patterned to form hard mask 160 using techniques of the type described in connection with the formation of hard mask 130. Hard mask 160 includes a pattern of openings 161, a few of which are specifically designated as openings 161a, 161b, 161c. Openings 161a, 161b, 161c expose surfaces 154a, 154c, 154d of conductors 153a, 153c, 153d, respectively. As shown in stage 100h of FIG. 9, dielectric layer 162 is deposited on hard mask 160 that generally fills and planarizes openings 161a–161c. Layer 162 is preferably comprised of an oxide of silicon that is etch selective to hard mask 160 and need not be of the low-k variety. More preferably, dielectric layer 162 is formed from a tetraethylorthosilicate (TEOS) or a Phosphosilicate Glass (PSG). Photoresist pattern 164 is formed on dielectric layer 162 using standard photolithographic techniques. Pattern 164 includes openings 164a–164c. In progressing from stage 100h of FIG. 9 to stage 100i of FIG. 10, dielectric layer 162 is selectively removed in accordance with pattern 164 to form patterned dielectric 172 therefrom. Preferably, removal is performed by conventional dry etching. Pattern 164 is then stripped off device 101 as shown in FIG. 10.

Dielectric 172 accordingly defines recesses 172a–172e. Recesses 172a–172e bottom-out on hard mask 160 where present as a result of its etch-stop characteristics. A conductive material is deposited in recesses 172a–172e to form conductors 173a–173e, where conductor 173a is partially shown. Hard mask 160 insulates conductors 173a–173c from unintentional electrical contact with conductors 153a–153d of layer 150. Collectively, dielectric 172 and conductors 173a–173e define connection layer 170.

Preferably, connection layer 170 includes via plugs, such as conductor 173e, and elongate conductors, such as conductors 173b and 173c, that are oriented with their longitude along an axis that is generally parallel to the view plane of FIG. 10 and perpendicular to the longitudinal axis of conductors 153a–153d in connection layer 150 below. In this manner, conductors of connection layer 170 may be used to provide a relatively short-run connections between conductors 153a–153d such as conductor 173c, which is further designated crossover or overpass connection 174. Connection 174 interconnects conductors 153a and 153c of connection layer 150 through openings 161a and 161b. Notably, conductor 173c crosses conductor 153b of connection layer 150 with electrical isolation being maintained by hard mask 160 positioned therebetween. The conductive material used to form conductors 173a–173e is preferably tungsten (W) that is deposited using CVD; or copper (Cu) or aluminum (Al) (or suitable alloys thereof) using a force fill technique. After deposition, device 101 is preferably planarized by a compatible CMP process. However, in other embodiments a different conductive material and planarization technique may be utilized as would occur to those skilled in the art.

Figure 11:
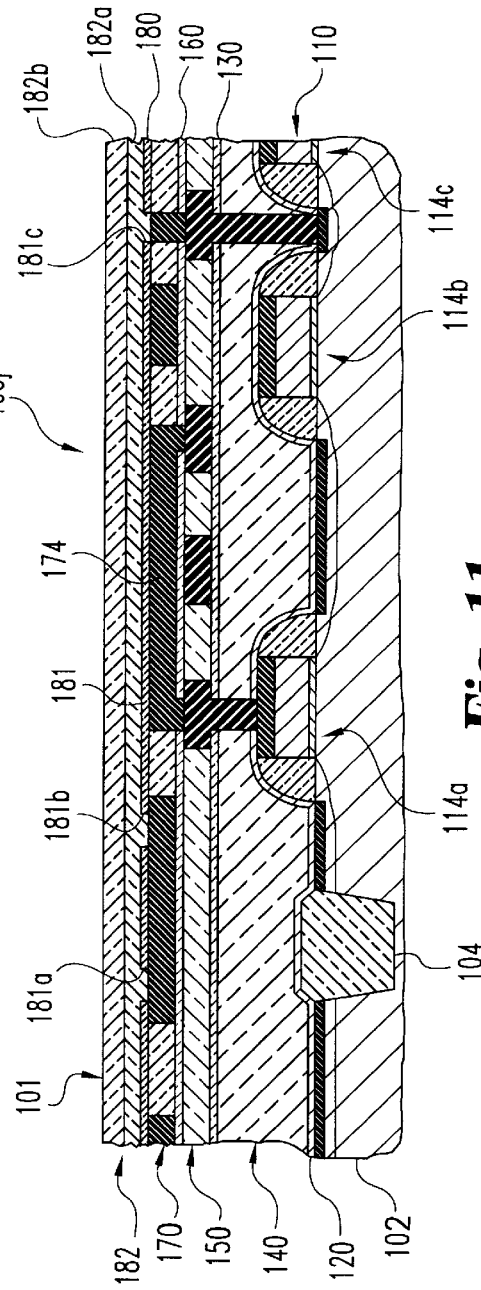

FIG. 11 depicts stage 100j which includes the addition of hard mask 180 and dielectric layer 182 to device 101 after stage 100i. Preferably, hard mask 180 is composed of a silicon nitride (SiN) or silicon oxynitride (SiON) and is formed using techniques like those used in the formation of hard masks 130 and 160.

Dielectric layer 182 is formulated to be etch selective to hard mask 180 and is preferably formed from two consecutive spun-on coatings 182a, 182b of a low-k or SOG dielectric, such as HSG. Coating 182a fills openings 181a–181c included in pattern of openings 181 of hard mask 180. Two coatings of SOG facilitate planarization, low-k performance, and subsequent laser customization. In other embodiments, a different dielectric composition including fewer or more coatings may be utilized.

Figure 12:
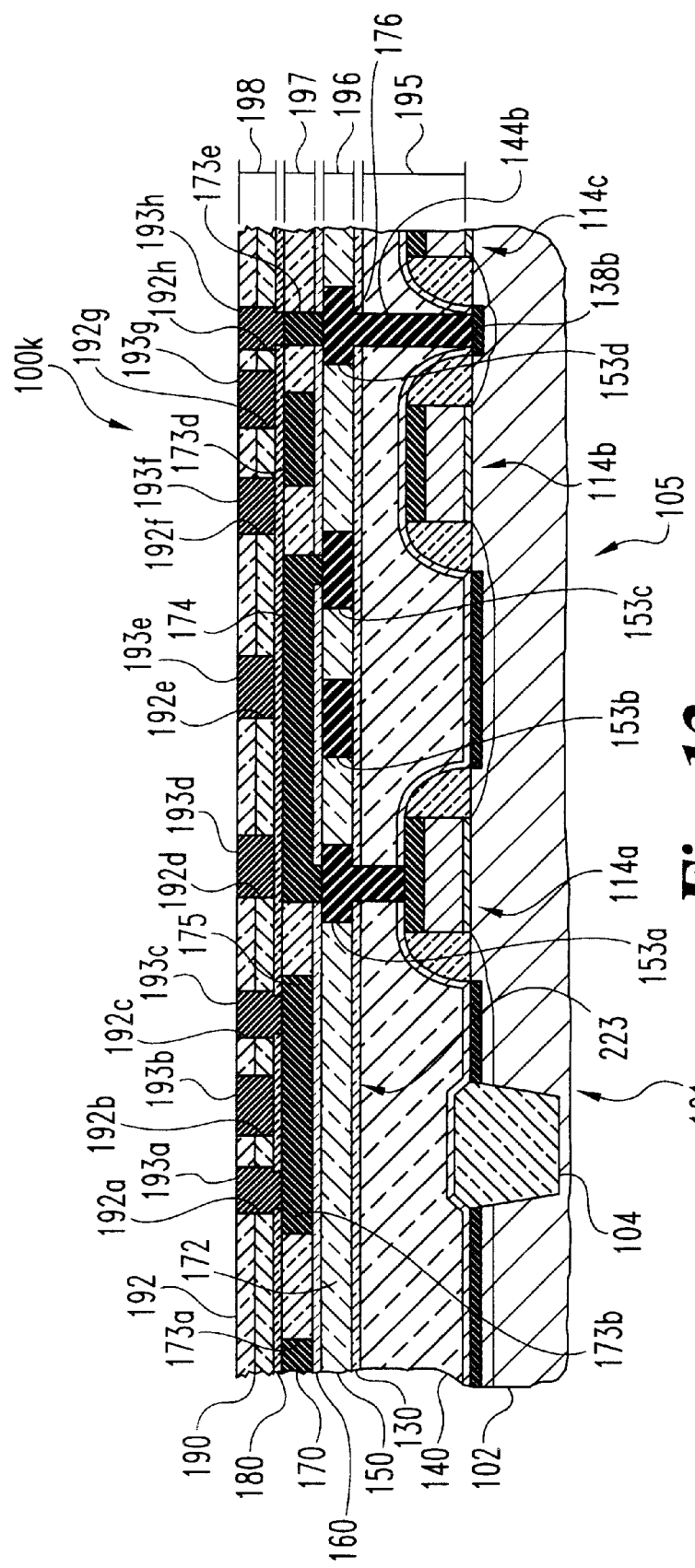

In FIG. 12, stage 100k illustrates device 101 after dielectric layer 182 has been patterned to form connection layer 190. Connection layer 190 includes patterned dielectric 192 formed from layer 182 and routing interconnect conductors 193a–193h. Dielectric 192 is preferably formed using techniques comparable to those used to transform dielectric layers 122, 132, 162 to patterned dielectrics 142, 152, 172, respectively. Dielectric 192 defines recesses 192a–192h that are filled with a conductive material to form routing interconnect conductors 193a–193h. Preferably, conductors 193a–193h are formed from the same conductive material as conductors 153a–153d of connection layer 150 using comparable techniques. Notably, conductors 193a–193h may be in contact with hard mask 180 which prevents unwanted electrical contact with conductors of layer 170.

Preferably, conductors 193a–193h of connection layer 190 are longitudinally oriented in a direction generally perpendicular to the view plane of FIG. 12 and generally parallel to the longitudinal axis of conductors 153a–153d of connection layer 150. Conversely, the elongate conductors of connection layer 170 are oriented generally crosswise to conductors 193a–193h and 153a–153d. This arrangement facilitates overpass or crossover connections, such as connection 174; and underpass or crossunder connections, such as conductor 173b, which has been further designated underpass or crossunder connection 175. Connection 175 interconnects conductors 193a and 193c through openings 181a and 181b of hard mask 180, respectively.

Figure 26:
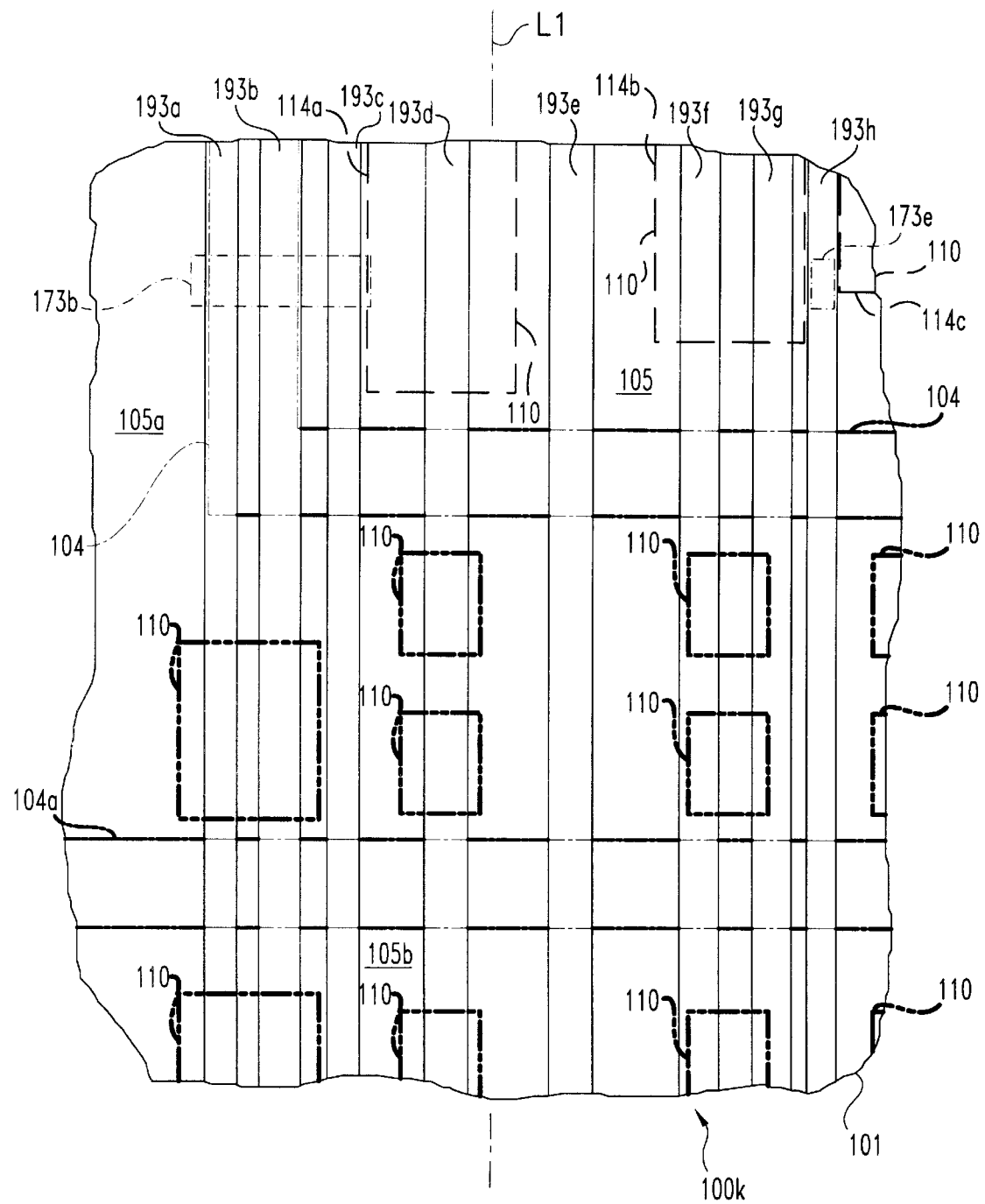
FIG. 26 is a partial, cut-away, top view of the integrated circuit device shown in FIG. 12.

FIG. 26 further illustrates the orientation of conductors in the different layers by providing a partial, top view of device 101 at stage 100k. In FIG. 26, selected features below layer 190 are shown in phantom. Notably routing interconnect conductors 193a–193h are generally parallel to each other with a longitudinal axis L1. FIG. 26 shows additional components 110 in regions 105a and 105b that are not shown in FIG. 12. Regions 105a, 105b are separated from each other by isolation structure 104a. Preferably, structure 104a is formed in the same manner as structure 104.

FIG. 26 also illustrates the configuration of conductors 193a–193h as routing interconnects that traverse several active silicon components 110. By extending over components 110, conductors 193a–193 may widely disperse signals over relatively long distances and provide interconnection of remotely located components. Interconnection to components 110 by conductors 193a–193h is provided through layers 140, 150, 170 and hard masks 130, 160, 180 as illustrated, for example, in FIG. 12 by via stack 176 that interconnects region 138b to conductor 193h. Conductors 153a–153d are also configured as routing interconnects along longitudinal axis L1 (not shown).

Referring additionally to FIG. 12, various connection levels corresponding to the connection layers 140, 150, 170, 190 are depicted. Connection level 195, provided by layer 140, is preferably comprised of contact-type connections to regions of components 110, such as plug conductors 144a, 144b. Connection levels 196 and 198 provide generally long-run routing interconnects that traverse several components of device 101 as further depicted in FIG. 26. Connection level 197, positioned between routing levels 196 and 198 provides crossover, crossunder, and via plug connections that serve levels 196, 198. Hard masks 130, 160, 180 provide selective interconnection of levels 195–198 and may contact conductors at levels 196–198 while maintaining desired electrical isolation. Notably, hard masks and connection levels above components 110 are generally planar in form to facilitate alignment and process control. These are but a few of the aspects of the present invention that facilitate a more flexible, higher density interconnection structure.

The interconnection structure of device 101 also facilitates the distribution of power supply conductors in a manner that facilitates a higher interconnection density. In contrast to existing systems, such distribution lines may be provided, for example, by conductors 173a, 173d in level 197, instead of sharing the same level as routing interconnects. This arrangement makes more routing interconnect space available in levels 196 and 198. Moreover, the pervasive nature of power supply conductor distributions typically interferes with efficient high-density routings for long-distance signals in levels 196, 198. In contrast, the relatively short connections and via plugs in the intervening level 197 do not suffer as greatly by inclusion of an extensive distribution of power supply conductors. Also, while it may be desirable to use a low-k dielectric between conductors in levels 196 and 198, power supply distribution conductors typically do not need the benefits provided by such materials; thus further supporting the location of the power supply conductors in level 197.

FIGS. 13–25 progressively illustrate selected stages 200a–200m of interconnection process 200. FIG. 13 illustrates intermediate stage 200a of integrated circuit device 201. Device 201 has substrate 102 and isolation structure 104 previously described in connection with process 100 and device 101; where like reference numerals refer to like features. Furthermore, device 201 includes doped regions 106a–106c and silicide substrate regions 108a–108c as are further described in connection with device 101. An additional silicide substrate region 208 is also identified in FIG. 13.

Device 201 also includes component region 205 with integrated circuit components 210. Integrated circuit components 210 may include transistors, resistors, capacitors, and other active or passive component types known to those skilled in the art. FIG. 13 specifically designates three transistor gate structures 214a–214c, where 214c is only partially shown. Substrate 102 and regions 106a–106c are arranged as discussed in connection with device 101 to provide IGFET transistors corresponding to gate structures 214a–214c, that are generally designated by reference numeral 212.

Gates 214a–214c have the same features described in connection with gates 114a–114c of device 101, including a dielectric gate pad, polysilicon portion, and silicide portion stack that is bounded by a corresponding pair of dielectric spacer walls. Different reference numerals 214a–214c are used to distinguish these structures as they are processed differently in later stages corresponding to FIGS. 14–25. Front-end processing of the device 101 to provide substrate 102, isolation structure 104, and components 210 as shown in FIG. 13 may be performed in the manner described for device 101.

After front-end processing, device 101 is coated with barrier layer 220 that is preferably formed from silicon nitride. A filler dielectric layer 222 is deposited on barrier layer 220 and has a thickness sufficient to fill space between gates 214a–214c and exceeds their height above substrate 102. Preferably, dielectric layer 222 is comprised of a silica-based material.

Stage 200b of FIG. 14 shows device 201 after planarization. Preferably, planarization is performed by a conventional CMP procedure, removing a portion of layer 220, layer 222, and gates 214a–214c resulting in generally planar surface 223. The planarization process exposes the remaining polysilicon members 217a, 217b of corresponding gates 214a, 214b and results in shortened spacers 219. Notably, silicide substrate regions 108a–108c and 208 remain covered by portions of barrier layer 220 and dielectric layer 222.

Figure 15:
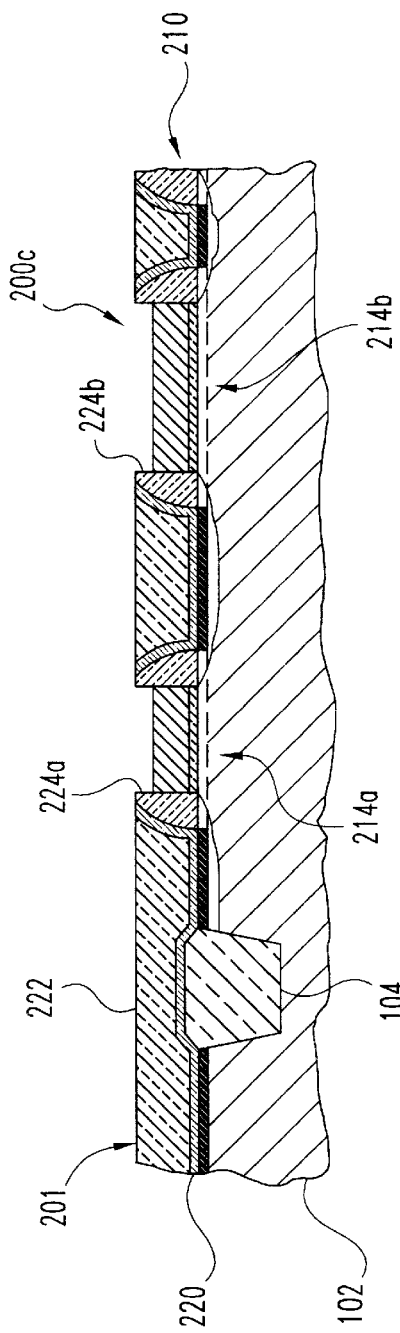

At stage 200c of FIG. 15, a further portion of polysilicon members 217a, 217b has been removed to define recesses 224a, 224b, respectively. Preferably, this removal is accomplished by a polysilicon selective etch-back that is controlled to leave a predetermined portion of polysilicon members 217a, 217b between corresponding pairs of shortened spacers 219 as shown. In one preferred embodiment, the etch-back chemistry includes chlorine gas and Hydrogen Bromide (HBr) at a temperature of about 60° C.; however, other etch chemistries or removal techniques may be employed as would occur to those skilled in the art.

Figure 16:
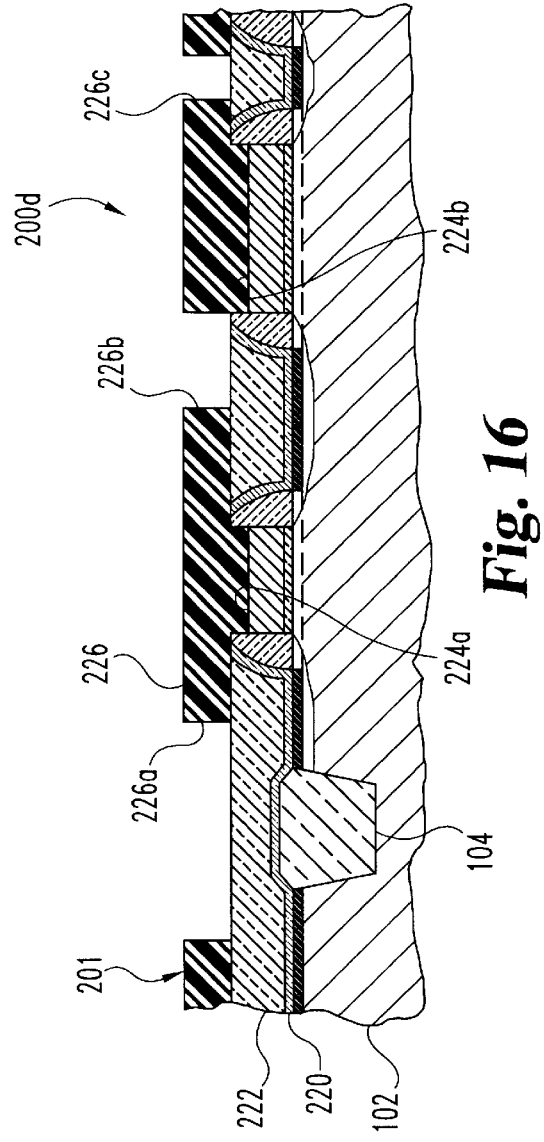

After partial removal of polysilicon members 217a, 217b, photoresist pattern 226 is provided on device 201 as illustrated in stage 200d of FIG. 16 using conventional lithography techniques. Pattern 226 defines openings 226a–226c for subsequent processing of device 201. Notably, pattern 226 fills recesses 224a, 224b of corresponding gates 214a, 214b.

Figure 17:
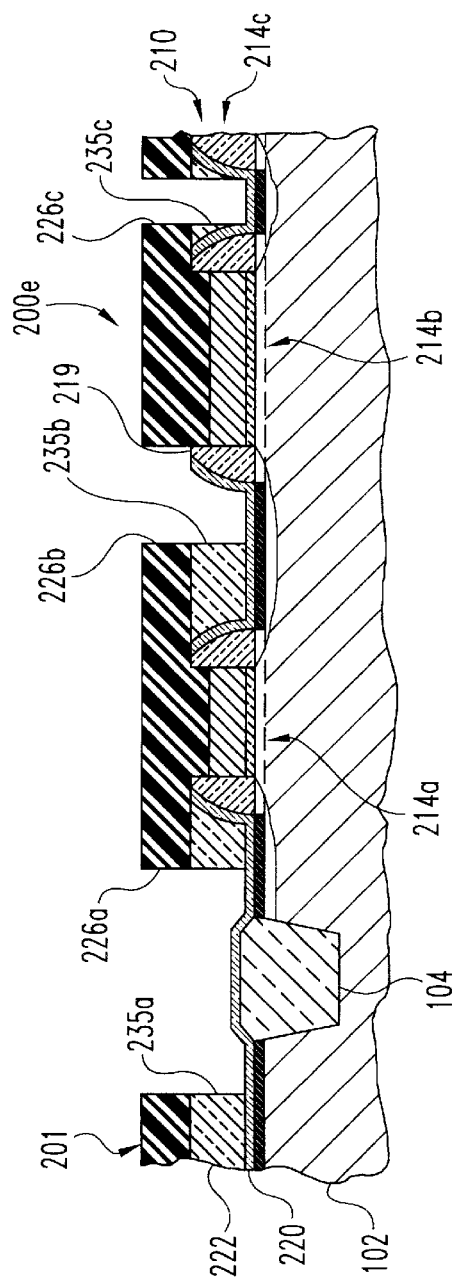
Figure 18:
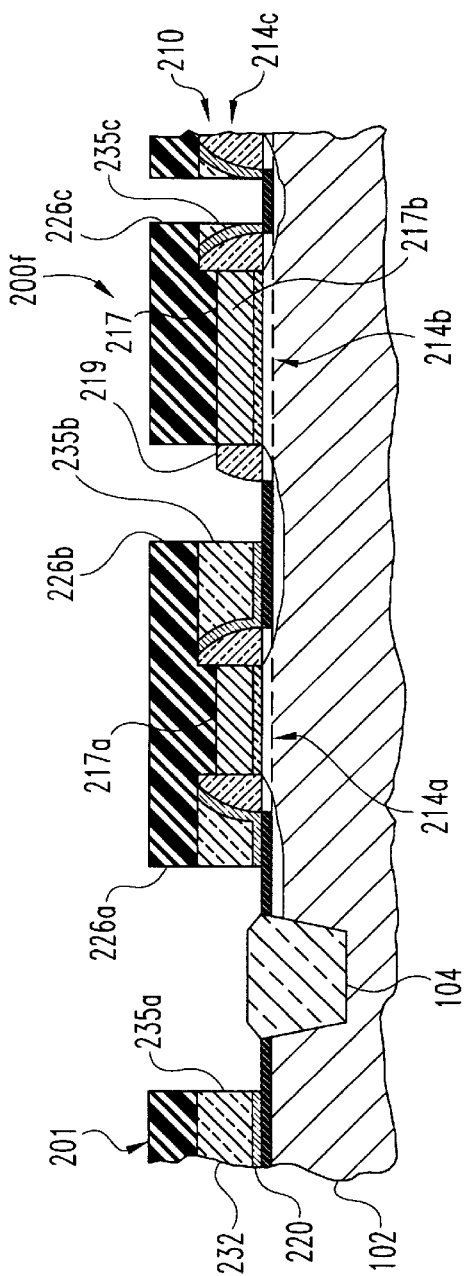

In stage 200e of FIG. 17, recesses 235a–235c are formed in correspondence with openings 226a–226c of pattern 226. Recesses 235a–235c are preferably formed by etching portions of dielectric layer 222 exposed through openings 226a–226c selective to barrier layer 220 and then layer 220 is etched where exposed in recesses 235a–235c selective to layer 222 using conventional techniques. If spacer 219 in recess 235b is formed from a dielectric that is mutually etched with layer 222, it may also be at least partially removed when layer 222 is removed to the extent it is exposed (not shown). However, it is preferred that layer 222 be etched selective to the dielectric comprising spacer 219 and that spacer 219 be mutually etched with layer 220 selective to layer 222. In stage 200f of FIG. 18, a portion, but not all, of spacer 119 in recess 235b has been removed to become generally level with polysilicon member 117b of gate 214b. Also, silicide substrate regions 108a–108c and 208 become selectively exposed to facilitate local electrical interconnection. Recesses 235b and 224b intersect one another in stage 200f. The formation of recesses 235a–235c transform layer 222 into patterned dielectric 232.

Figure 19:
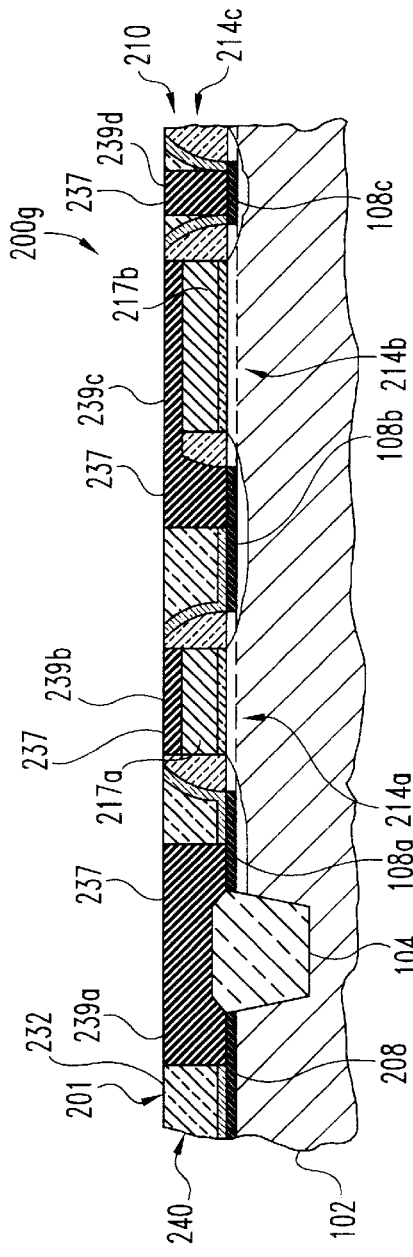

As shown in stage 200g of FIG. 19, pattern 226 is removed and a conductive material is deposited to generally fill recesses 224a, 224b, 235a, 235b, 235c. Preferably, the conductive material is a metal that may be deposited by a conventional process followed by planarization of device 101 to remove metal lying outside of the corresponding recesses. In one preferred embodiment, tungsten is deposited through a chemical vapor deposition of tungsten hexafluoride ($WF_6$) followed by a compatible CMP to remove excess metal; however, other conductive materials and deposition processes may be utilized as would occur to those skilled in the art. The resulting conductors 237 include local interconnect 239a bridging isolation structure 104 and connecting silicide substrate regions 208 and 108a. In addition, recess 224a formed in gate 214a is filled to define a conductive cap 239b. Local interconnect 239c bridges silicide substrate region 108b and polysilicon member 217b of gate 214b. Silicide substrate region 108c is electrically connected to via plug 239d. Collectively, patterned dielectric 232 and conductors 237 constitute connection layer 240. Commonly owned U.S. patent application Ser. No. 08/855,740 to Harvey et al., filed Jun. 30, 1997, further details selected aspects of stages 200a–200g, and is hereby incorporated by referenced in its entirety.

Figure 20:
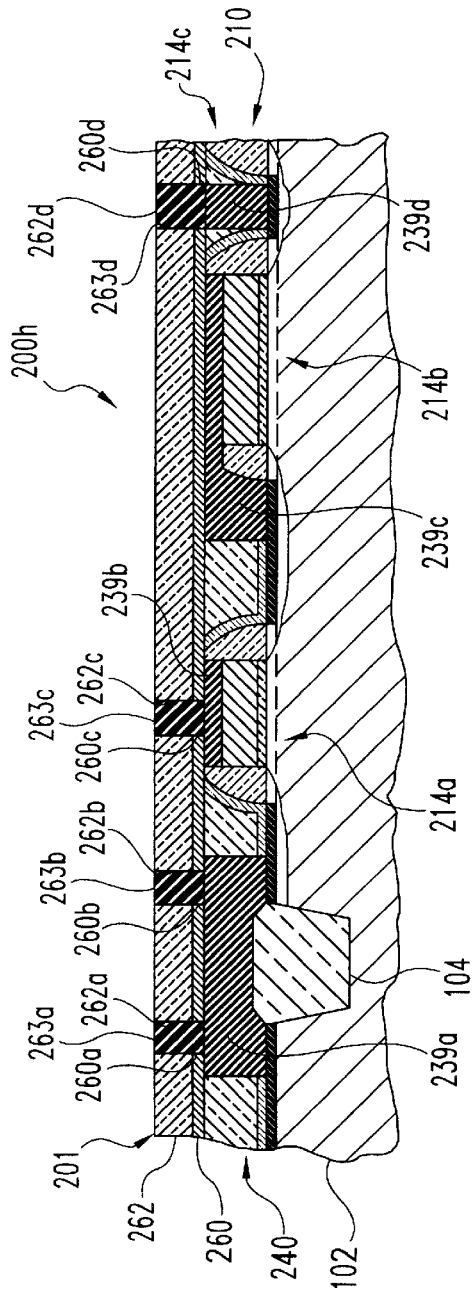

In stage 200h of FIG. 20, device 201 has been further processed to include hard mask 260 on connection layer 240.

Hard mask 260 includes openings 260a–260d. Hard mask 260 may be formed using the same materials and processes as hard masks 130, 160, and 180 of device 101.

Patterned dielectric 262 is formed over hard mask 260 from a material that may be etched selective to hard mask 260. Dielectric 262 defines a number of via holes 262a–262d aligned with openings 260a–260d of hard mask 260. A conductive material is deposited in via holes 262a–262d to define corresponding conductors of a plug or cap type designated by reference numerals 263a–263d. Preferably, hard mask 260 is comprised of silicon nitride or silicon oxynitride to provide antireflective characteristics as well as an etch-stop capability relative to dielectric 262. For this composition of hard mask 260, it is preferred that dielectric 262 be comprised of a silica-based compound such as TEOS or PSG. As in the case of conductors 237 for connection layer 240, it is preferred that conductors 263a–263d be formed by a chemical vapor deposition of tungsten in openings 262a–262d, respectively, followed by an appropriate CMP procedure to generally maintain planarity and remove any excess metal.

Figure 21:
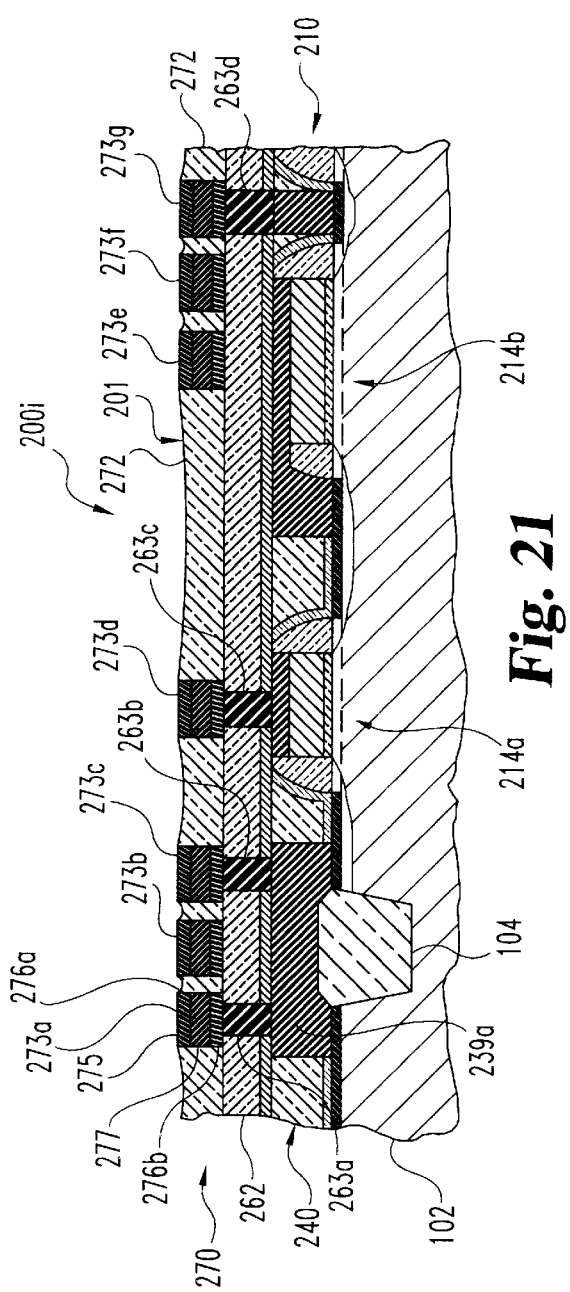

In stage 200i of FIG. 21, device 201 has been further processed to include patterned dielectric 272 and routing interconnect conductors 273a–273g. Dielectric 272 and conductors 273a–273g may be formed using conventional processes. As specifically illustrated for conductor 273a, conductor layer stack 275 is illustrated. Stack 275 includes upper diffusion barrier/adhesion layer 276a and lower diffusion barrier/adhesion layer 276b. Between layers 276a and 276b is primary conductive layer 277. This arrangement of stack 275 is particularly suited for long-run routing interconnects where a highly conductive material such as copper or aluminum is desired that may otherwise diffuse into the surrounding material or not properly adhere to it. For this embodiment, copper or aluminum preferably constitute the primary conductive layer 277 with compatible compositions for barrier/adhesion layers 276a, 276b. In one instance, a titanium nitride formulation of layers 276a, 276b is preferred.

Collectively, dielectrics 262, 272 and conductors 263a–263b, 273a–273g constitute connection layer 270 as illustrated in FIG. 21. Conductors 273a–273g are elongate, having a longitudinal axis that is generally perpendicular to the view plane of FIG. 21. Conductors 237 of connection layer 240 may further be utilized to electrically couple selected conductors of connection layer 270. For example, local interconnect 239a electrically couples conductors 273a and 273c via conductors 263a and 263b, respectively, to additionally provide an underpass or crossunder type of connection.

Conductors 273a–273g are formed using conventional photolithographic techniques. Preferably, dielectric 272 is formed from a spun-on coating of a low-k SOG, such as HSG. In a variation of stages 200h and 200i, dielectric 262 and corresponding conductors 263a–263d are not utilized. Instead, conductors 273a–273g and dielectric 272 are formed directly on hard mask 260. In this alternative, connection layer 270 comprises a single layer of patterned dielectric with corresponding conductors spaced therethrough. Correspondingly, interconnection formation would be adapted for direct contact with routing interconnects through openings 260a–260d in hard mask 260.

Figure 22:
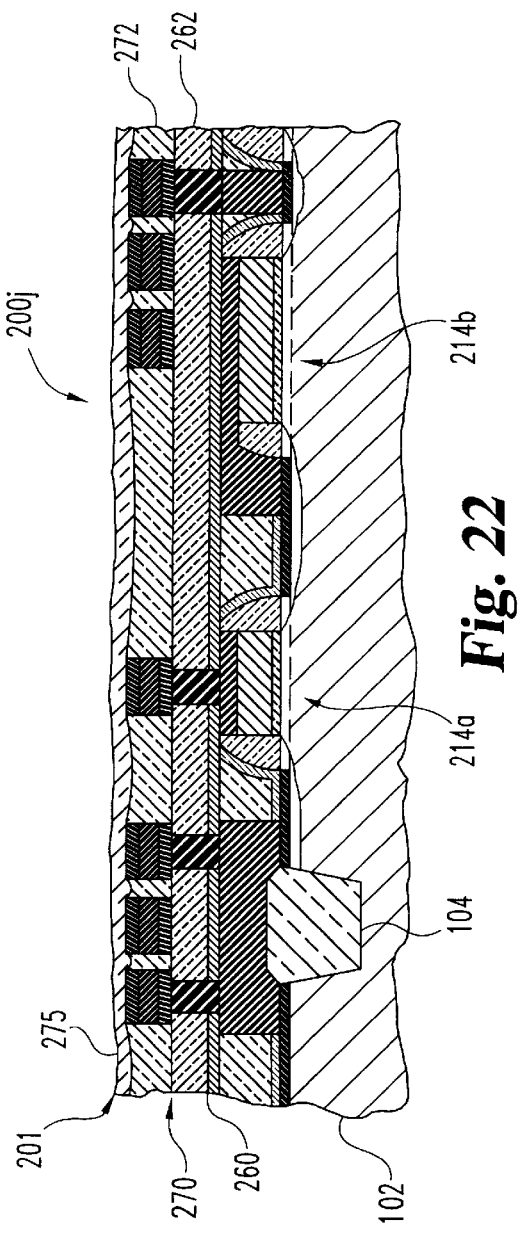
Figure 23:
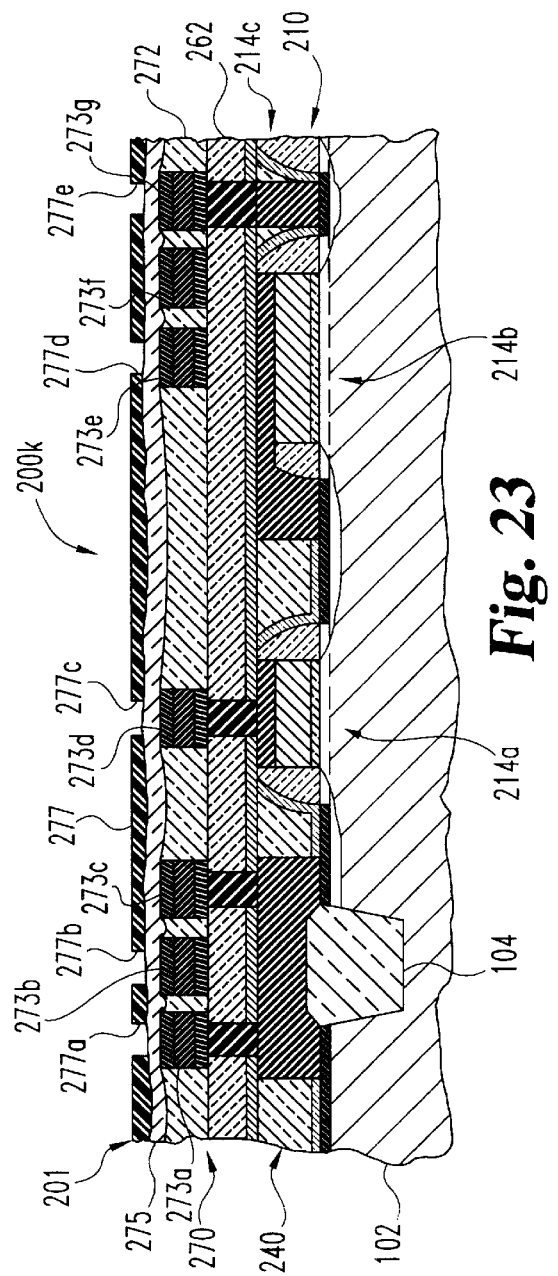
Figure 24:
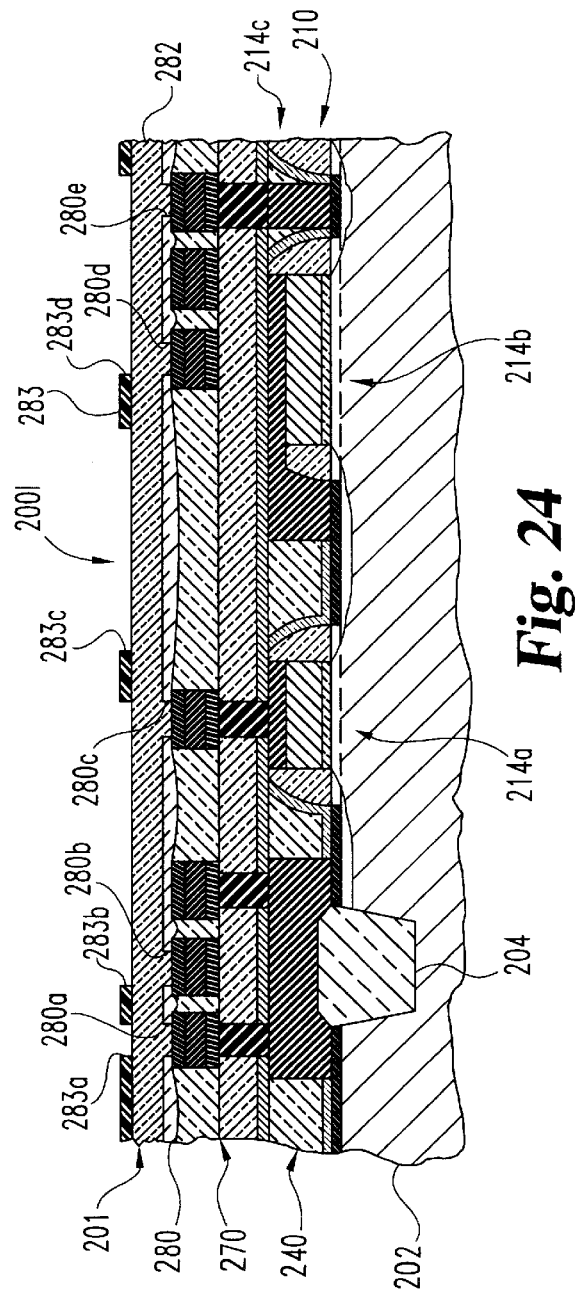

Stage 200j is shown in FIG. 22 that indicates further processing of device 201 by adding insulative layer 275. Preferably, insulative layer 275 is formed from the same material as hard mask 260. In stage 200k of FIG. 23, a photoresist pattern 277 is formed using conventional photolithographic techniques which defines a number of openings 277a–277e over selected conductors 273a, 273b, 273d, 273e, 273g; respectively. Selective removal of layer 275 is performed in accordance with pattern 277 to define openings 280a–280e, and correspondingly form hard mask 280 as shown in stage 200l of FIG. 24. Pattern 277 is stripped after formation of openings 280a–280e. Stage 200l also reflects further processing of device 201 by depositing another relatively thick dielectric layer 282 that is preferably of a TEOS or PSG composition. Once deposited, layer 282 is planarized, preferably by a compatible CMP procedure. Layer 282 is preferably formed from a material that is etch selective to hard mask 280. Photoresist pattern 283 is then defined on top of layer 282 with openings 283a–283d, using conventional photolithographic techniques.

Figure 25:
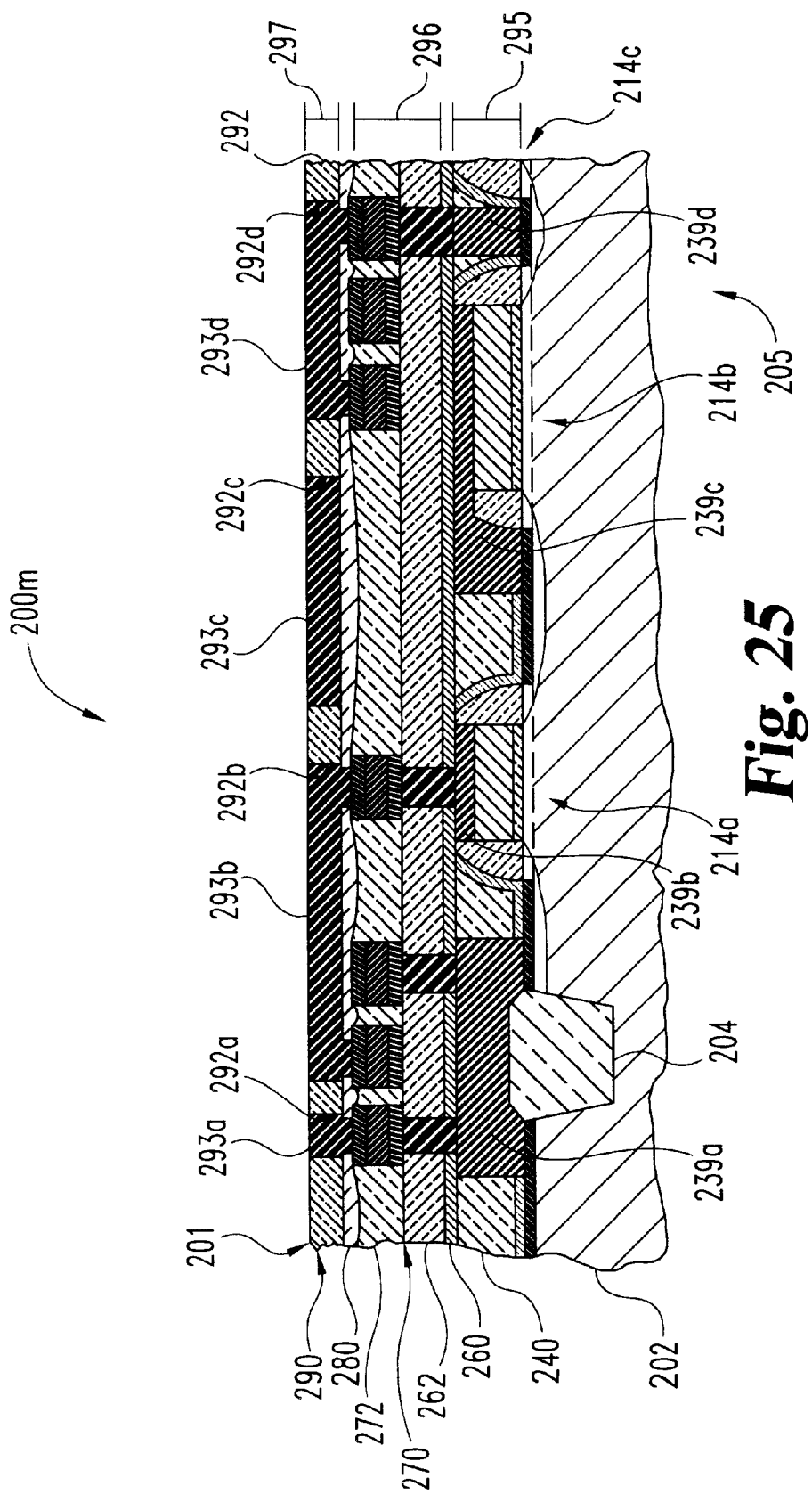

FIG. 25 depicts device 201 at processing stage 200m. At stage 200m, layer 282 has been selectively removed, preferably by conventional etching, to form patterned dielectric 292 therefrom. Dielectric 292 defines recesses 292a–292d corresponding to openings 283a–283d of pattern 283. Recesses 292a–292d are filled with a conductive material to provide additional conductors 293a–293d. Notably, conductor 293a is a via plug and conductors 293b, 293d are crossover or overpass connections. As in the case of layer 240, it is preferred that conductors 293a–293d be formed from a metal, such as tungsten (W), using a conventional fill technique followed by removal of any excess metal outside recesses 292a–292d. Collectively, dielectric 292 and conductors 293a–293d define connection layer 290.

Figure 27:
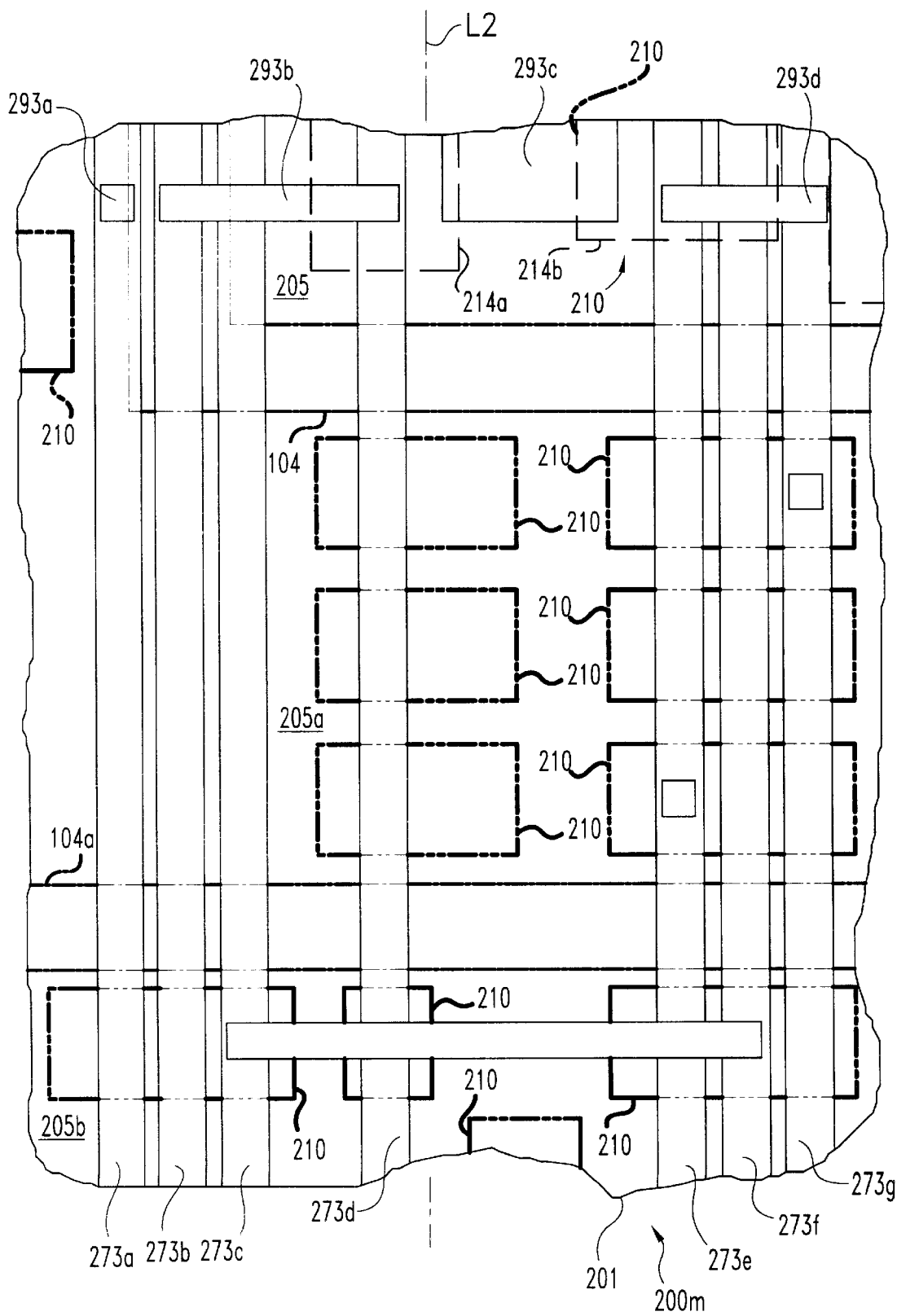
FIG. 27 is a partial, top view of the integrated circuit device shown in FIG. 25.

At stage 200m, device 201 includes interconnection levels 295, 296, 297. Level 295 preferably provides short-run connections such as via plugs, local interconnects, and underpass or crossunder connections for higher levels. Preferably, level 296 provides routing interconnects over relatively long distances through device 201. Level 297 is preferred for additional short-run connections such as the via plug, crossover, or overpass variety, and may also be utilized for conductors carrying relatively time-invariant signals such as power supply busses. Referring additionally to FIG. 27, a partial, cut-away top view of device 201 at stage 200m is presented. Selected features of layer 290 and 270 are shown in solid lines and selected features below layer 270 are shown in phantom. FIG. 27 further depicts components 210 in regions 205a and 205b not shown in FIG. 25. Regions 205a and 205b are separated by isolation structure 104a as described in connection with FIG. 26. The routing interconnect arrangement of each conductor 273a–273g is also further illustrated in FIG. 27. Conductors 273a–273b are generally parallel to each other extending along their longitudinal axis L2 over components 210.

In both process 100 and process 200, the segregation of routing interconnects for high speed signals from other types of connections provides a more efficient allocation of low-k dielectrics and facilitates higher interconnect density by increasing routing uniformity at little increase in terms of cost and processing complexity. Also, as provided in processes 100, 200; the separation of connection layer dielectrics with insulative hard masks that may be etched selective to each other enhances interconnection process control— especially as the critical dimensions of integrated circuit components continue to shrink below 0.25 micron. If the preferred interconnection arrangement leads to contact of a SOG dielectric of a connection layer with a silicon nitride or silicon oxynitride hard mask, wettability may be improved by a surface treatment with an $H_2O$-plasma or dry $O_2$ ash.

Preferably, process 100 is applied to further layout flexibility beyond conventional Damascene techniques and thereby enable interconnection of devices having critical dimensions of less than about 0.20 micron. Process 200 is preferably applied devices having a critical dimension in the range of about 0.25 to about 0.35 micron. However, processes 100, 200 may be applied to devices having any critical dimension. Moreover, in alternative embodiments, stages 100a–100k and 200a–200m of processes 100 and 200, respectively, may be intermixed, rearranged, substituted, deleted, duplicated, combined, or added as would occur to those skilled in the art. Also, fewer or more connection layers may be utilized in either process 100, 200. Further, the connection layers of processes 100 and 200 may be intermixed in alternative embodiments to optimize the interconnection approach best-suited to a particular integrated circuit arrangement.

In addition, it should be understood that devices 101, 102 include only a few representative integrated circuit components 110, 210, respectively. Typically the present invention would be applied to devices having a greater quantity of integrated circuit components than depicted; however, illustrating such quantities would needlessly complicate the figures. Similarly, different active or passive integrated circuit component types as would occur to those skilled in the art may additionally or alternatively be included, but have not been specifically described to enhance clarity.

It is contemplated that various functional blocks, operators, operations, stages, conditionals, procedures, thresholds, and processes described in connection with the present invention could be altered, rearranged, substituted, deleted, duplicated, combined, or added as would occur to those skilled in the art without departing from the spirit of the present invention. All publications, patents, and patent applications cited in this specification are herein incorporated by reference as if each individual publication, patent, or patent application were specifically and individually indicated to be incorporated by reference and set forth in its entirety herein. While the invention has been illustrated and described in detail in the drawings and foregoing description, the same is to be considered as illustrative and not restrictive in character, it being understood that only the preferred embodiments have been shown and described and that all changes, modifications and equivalents that come within the spirit of the invention as defined by the following claims are desired to be protected.

What is claimed is:

1. A method of integrated circuit manufacture, comprising:

providing a number of electronic components along a semiconductor substrate, and a first connection layer comprised of a first dielectric and a first number of conductors in selective electrical contact with the components;

forming a first insulative layer on the first connection layer with a first pattern of openings therethrough;

establishing a second connection layer comprised of a second dielectric and a second number of conductors selectively interconnecting the first conductors through the first pattern of openings;

forming a second insulative layer on the second connection layer with a second pattern of openings therethrough; and establishing a third connection layer on the second insulative layer comprised of a third dielectric and a third number of conductors selectively interconnecting the second conductors, the third dielectric being etch selective to the second insulative layer, the second and third conductors being in contact with the second insulative layer, and at least one of the second conductors crossing at least one of the third conductors and being electrically isolated therefrom by the second insulative layer.

2. The method of claim 1, wherein the second conductors or the third conductors are each formed as an elongated metal routing interconnect extending over several of the components to route a corresponding long-distance signal.

3. The method of claim 1, wherein at least one of the second conductors is operable to provide a power supply voltage to the components.

4. The method of claim 1, wherein:

the first conductors and the third conductors are formed as elongate metal routing interconnects to extend over several of the components and provide long-distance signal routing; and the second conductors include at least one crossover connection electrically interconnecting at least two of the first conductors and at least one crossunder connection electrically interconnecting at least two of the third conductors.

5. The method of claim 1, wherein said providing includes:

depositing a coating of the first dielectric over the components;

etching the coating to define a first number of recesses each exposing two contact surfaces of the components; and depositing a metallic material in the first recesses to form a corresponding first subset of the first conductors each providing a local interconnection between the two surfaces exposed by a respective one of the first recesses.

6. The method of claim 5, wherein said etching further includes defining a second number of recesses in the coating each exposing a contact surface of a corresponding one of the components and said depositing includes filling the second recesses with the metallic material to provide a corresponding second subset of the first conductors.

7. The method of claim 5, wherein the second conductors include a number of metal plugs and a number of elongate metal routing interconnects each extending over several of the components, the plugs are positioned between the first conductors and the routing interconnects to electrically interconnect the first conductors and the routing interconnects in correspondence with the first pattern of openings, and the second dielectric material is etch selective relative to the first insulative layer.

8. The method of claim 1, wherein the second conductors are formed in recesses defined in the second dielectric material, the second conductors contact the first insulative layer, and the second dielectric is etch selective relative to the first insulative layer.

9. The method of claim 1, wherein said providing includes:

depositing a dielectric coating over the components;

planarizing the dielectric coating after said depositing;

depositing a insulative film on the coating after said planarizing; and etching the film to define the first pattern of openings;

forming a layer of the first dielectric on the film;

etching the first dielectric and the dielectric coating selective to the film to form a number of recesses, at least a portion of the recesses passing through the first pattern of openings; and depositing metal in the recesses to form the first conductors.

10. The method of claim 1, wherein:
said forming the first insulative layer includes depositing a dielectric film on the first connection layer and etching the film to define the first pattern of openings; and
said establishing the second connection layer includes covering the first insulative layer with a coating of the second dielectric, etching the coating of the second dielectric to define a number of recesses, and depositing a conductive material in the recesses to provide the second conductors.

11. The method of claim 1, wherein:
said forming the second insulative layer includes depositing a dielectric film on the second connection layer and etching the film to define the second pattern of openings; and
said establishing the third connection layer includes covering the second insulative layer with a coating of the third dielectric, etching the third dielectric to define a number of recesses, and depositing a conductive material in the recesses to provide the third conductors.

12. The method of claim 1, wherein the first, second, and third dielectrics are predominantly composed of silicon dioxide, and the first and second insulative layers are predominantly composed of silicon nitride or silicon oxynitride.

13. A method of integrated circuit manufacture, comprising:
providing a number of electronic components on a substrate;
planarizing a first dielectric layer formed over the components;
forming a first insulative hard mask on the first layer and a second dielectric layer on the first hard mask, a first pattern of openings being defined through the first hard mask;
etching the first and second layer selective to the first hard mask to form a first number of recesses in the second layer, at least a portion of the first recesses being coincident with the first pattern of openings to extend through the first layer;
at least partially filling the first recesses to define a first number of conductors in elective contact with the components through the first pattern of openings;
depositing a second insulative hard mask on the second layer and a third dielectric layer on the second hard mask;
etching the third layer selective to the second hard mask to define a second number of recesses therein;
at least partially filling the second recesses to define a second number of conductors selectively connecting the first conductors through a second pattern of openings in the second hard mask;
depositing a third insulative hard mask on the third layer and a fourth dielectric layer on the third hard mask;
etching the fourth layer selective to the third hard mask to form a third number of recesses therein; and
at least partially filling the third recesses to define a third number of conductors selectively connected by the second conductors through a third pattern of openings in the third hard mask, at least a portion of the first and third conductors being routing interconnects.

14. The method of claim 13, wherein the first layer and the second layer are composed of silicon dioxide and the first hard mask is composed of silicon nitride or silicon oxynitride.

15. The method of claim 13, wherein the third layer is composed of silicon oxide and the second hard mask is composed of silicon nitride or silicon oxynitride.

16. The method of claim 15, wherein the fourth layer is composed of silicon oxide and the third hard mask is composed of silicon nitride or silicon oxynitride.

17. The method of claim 13, wherein the second conductors provide a number of overpass interconnections between the first conductors and a number of underpass interconnections between the third conductors.

18. The method of claim 13, wherein the first and third conductors are all elongate metal routing interconnects extending over several of the components to provide long-distance signal routing.

19. The method of claim 13, wherein the second conductors provide a number of power supply connections.

20. The method of claim 13, wherein the first, second, third, or fourth layers are each etch selective to the first, second, and third hard masks; and the first, second, and third hard masks are each etch selective to the first, second, third, and fourth layers.

21. A method of integrated circuit manufacture, comprising:
providing a number of electronic components on a substrate;
selectively removing a first dielectric layer deposited over the components to define a first number of recesses each exposing at least two electrical contact surfaces of the components;
at least partially filling each of the recesses in the first layer to provide a corresponding number of local interconnects between the at least two contact surfaces;
forming a first insulative hard mask on the first layer and local interconnects, a second dielectric layer including a first number of conductors over the first hard mask, and a second hard mask over the first conductors, the first conductors being selectively electrically coupled to the components through a first pattern of openings in the first hard mask;
forming a third dielectric layer in contact with the second hard mask;
etching the third layer selective to the second hard mask to form a second number of recesses; and
at least partially filling the second recesses to define a second number of conductors in the third layer selectively connecting the second conductors through a second pattern of openings defined by the second hard mask, the first routing interconnects and the second routing interconnects being in contact with the second hard mask.

22. The method of claim 21, wherein the first layer and the second layer are composed of silicon dioxide, and the first hard mask and the second hard mask are composed of silicon nitride or silicon oxynitride.

23. The method of claim 21, wherein the first conductors include a number of via plugs electrically coupled to the local interconnects in correspondence with the first pattern of openings.

24. The method of claim 23, wherein the first conductors further include a plurality of routing interconnects.

* * * * *